United States Patent [19]

Aihara

[11] Patent Number: 5,923,677
[45] Date of Patent: Jul. 13, 1999

[54] METHOD AND APPARATUS FOR DETECTING FAILURES BETWEEN CIRCUITS

[75] Inventor: Kenichi Aihara, Tokyo, Japan

[73] Assignee: Sony Corporation, Tokyo, Japan

[21] Appl. No.: 08/841,948

[22] Filed: Apr. 8, 1997

[30] Foreign Application Priority Data

Apr. 11, 1996 [JP] Japan ................................. 8-089821
Feb. 13, 1997 [JP] Japan ................................. 9-029300

[51] Int. Cl.⁶ .................................................. G01R 31/28
[52] U.S. Cl. ........................................... 371/27.1; 348/180
[58] Field of Search ............................... 371/27.1, 20.1,
371/21.4, 22.33, 22.36, 22.5, 25.1, 27.2,
27.7, 37.6; 395/183.06, 421.07, 183.01,
183.13, 183.19, 183.15; 364/550; 365/201;
348/180, 181

[56] References Cited

U.S. PATENT DOCUMENTS

| | | | |
|---|---|---|---|
| 5,163,051 | 11/1992 | Biessman et al. ..................... | 371/5.1 |
| 5,228,042 | 7/1993 | Gauthier et al. ...................... | 371/20.5 |
| 5,239,536 | 8/1993 | Masuko et al. ....................... | 370/15 |
| 5,535,164 | 7/1996 | Adams et al. ......................... | 365/201 |
| 5,553,082 | 9/1996 | Conner et al. ........................ | 371/25.1 |
| 5,614,944 | 3/1997 | Taura et al. .......................... | 348/183 |
| 5,668,817 | 9/1997 | Adham .................................. | 371/22.4 |

*Primary Examiner*—Robert W. Beausoliel, Jr.
*Assistant Examiner*—Nadeem Iqbal
*Attorney, Agent, or Firm*—Frommer Lawrence & Haug, LLP.; William S. Frommer; Dennis M. Smid

[57] ABSTRACT

A method and apparatus for diagnosing or detecting failures or faults in or between circuits such as signal processing circuits of a video camera system. Predetermined test pattern data may be generated on a first or transmitting side (circuit) and discrimination pattern data having substantially the same data pattern as the test pattern data may be generated on a second or receiving side (circuit) in synchronism with the test pattern data. The test pattern data and the discrimination pattern data may be compared. A failure or faulty spot in or between circuits may be determined in accordance with the results of such comparison.

28 Claims, 18 Drawing Sheets

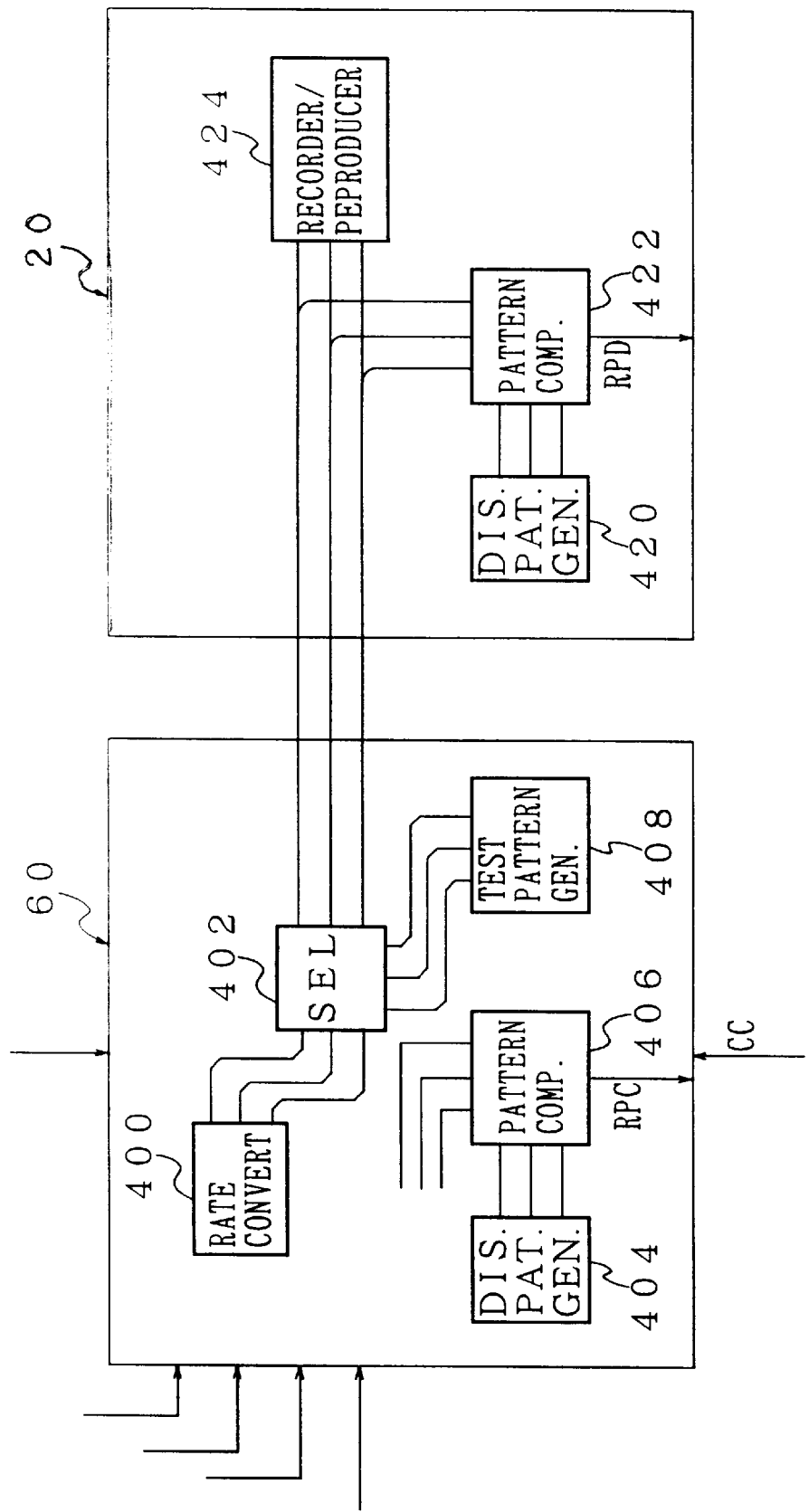

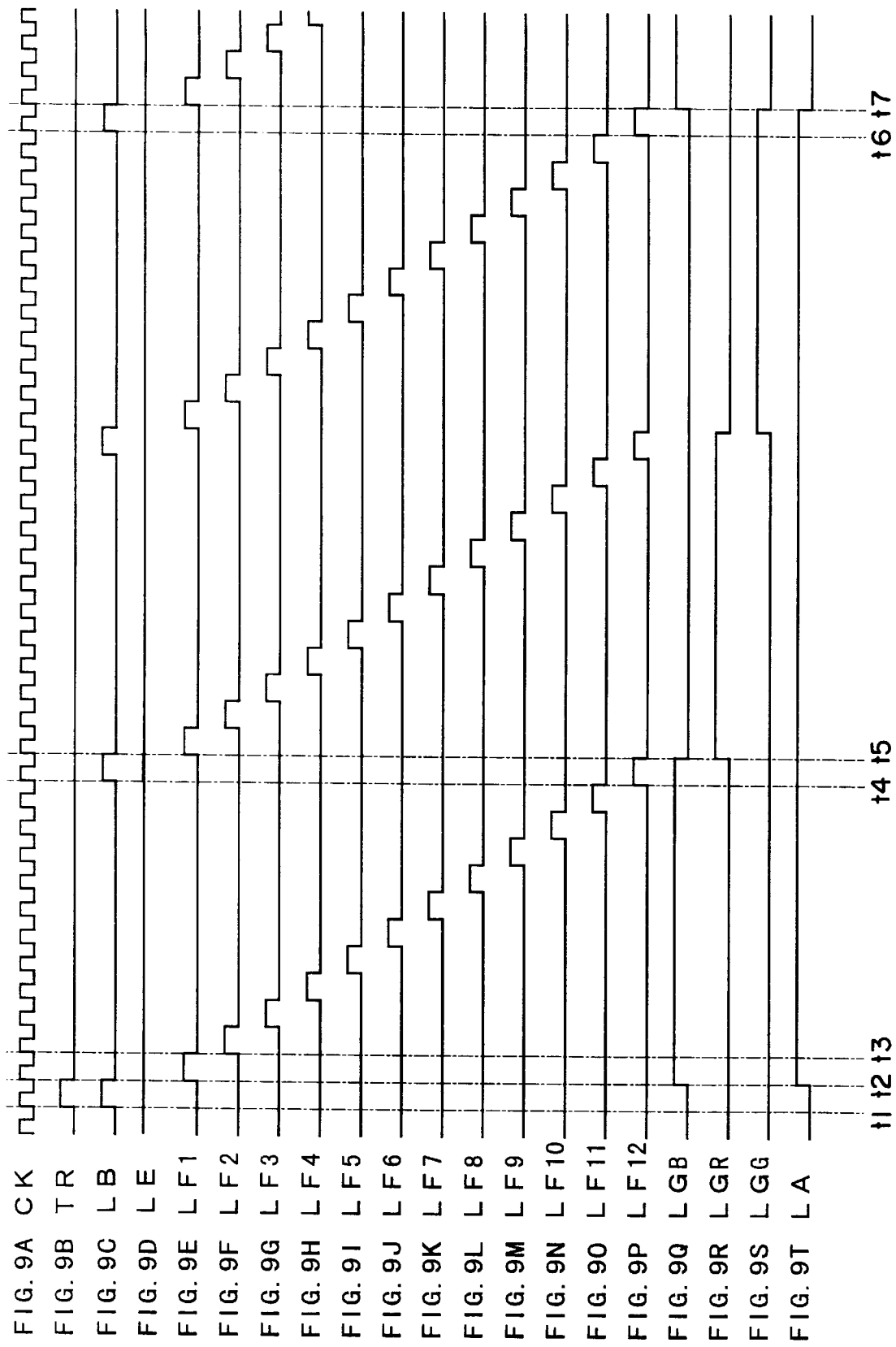

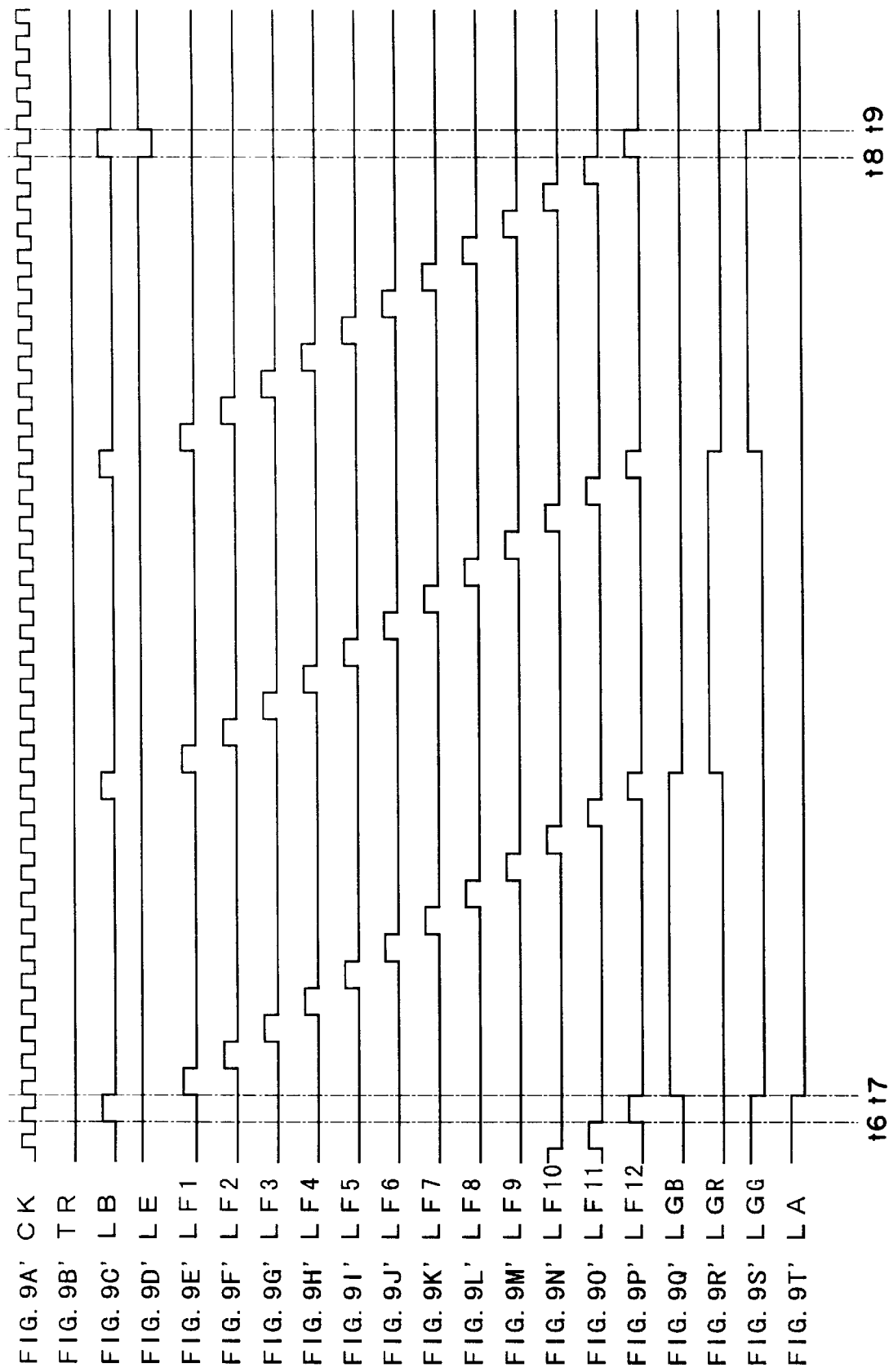

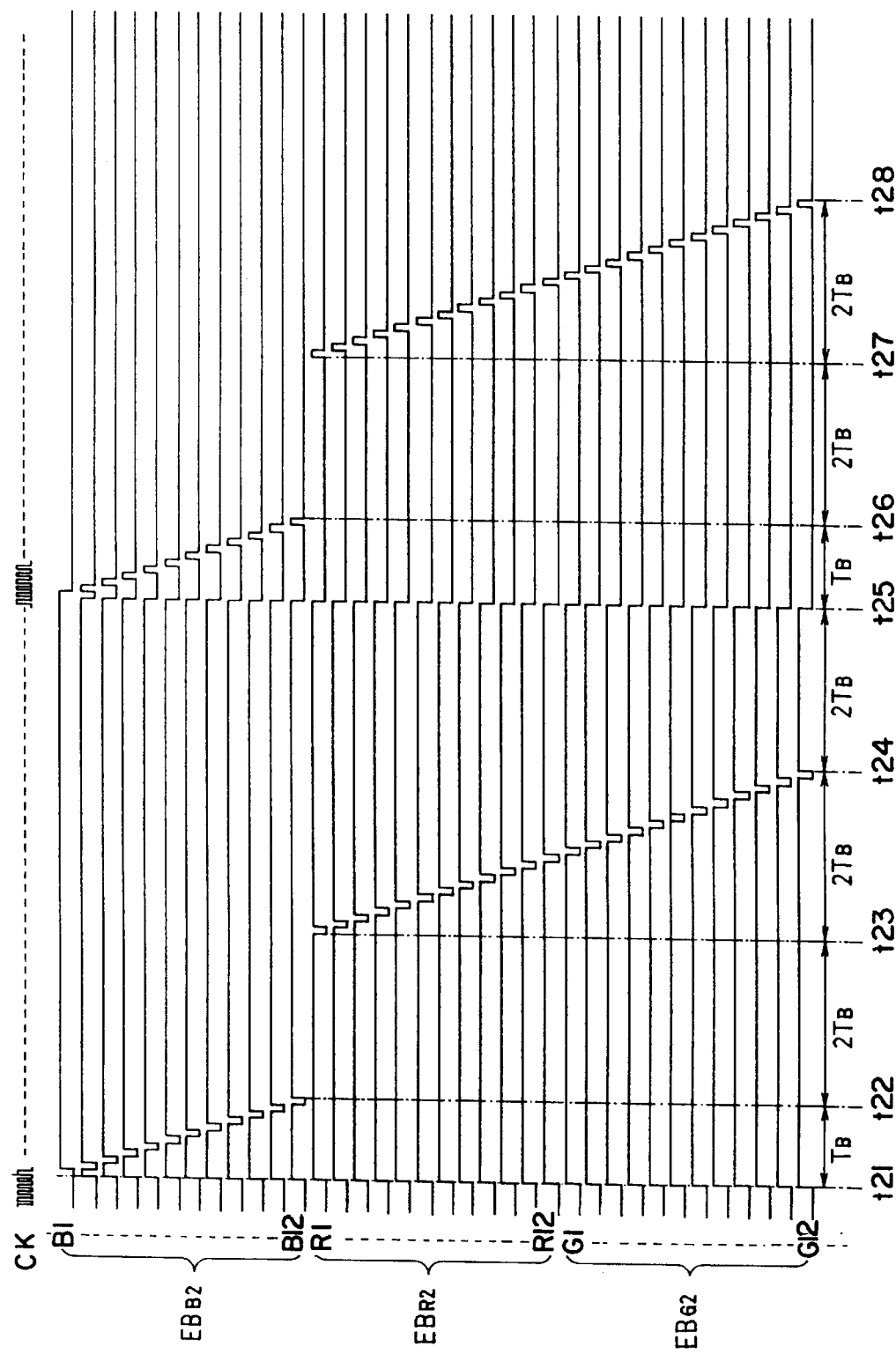

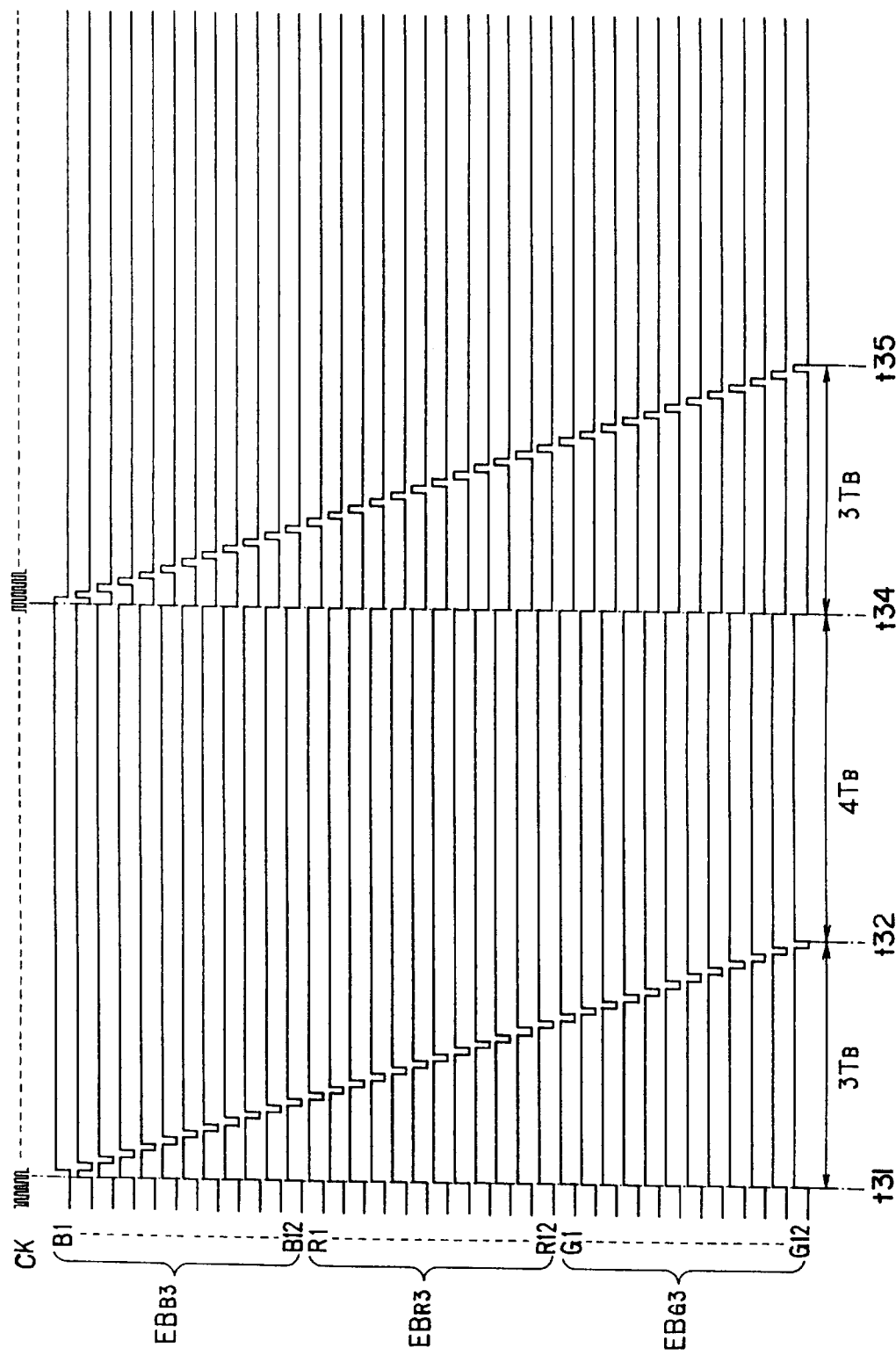

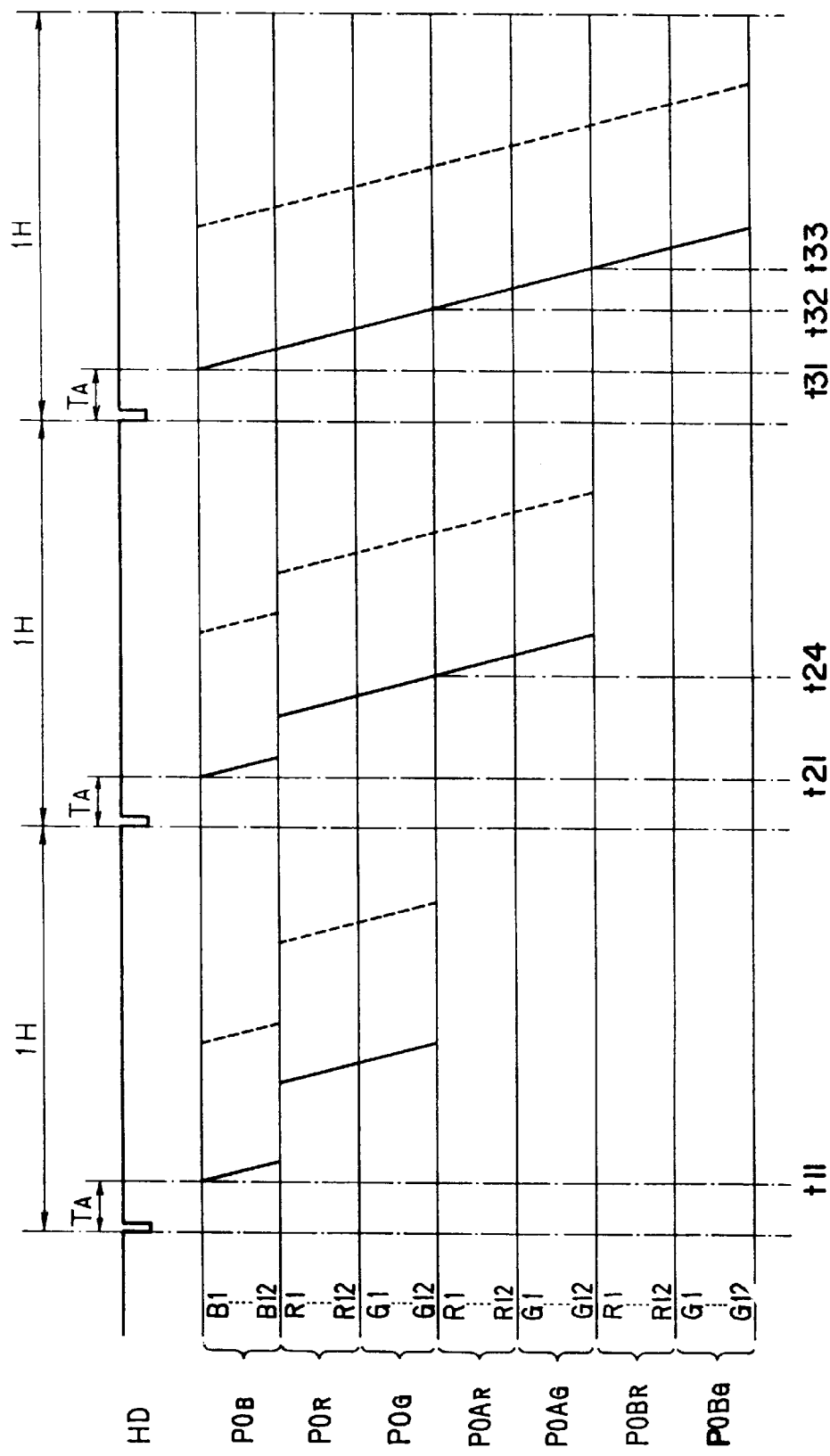

ized form, it may be difficult to locate the faulty spot or spots. As a result, the time and cost to locate and repair a fault may be relatively large.

METHOD AND APPARATUS FOR DETECTING FAILURES BETWEEN CIRCUITS

BACKGROUND OF THE INVENTION

The present invention relates to a method and apparatus for diagnosing or detecting faults in circuits such as signal processing circuits of a video camera system.

In a digital signal processing circuit of an electronic apparatus or system, such as a digital video camera system, an analog image-sensed signal obtained from a charge-coupled device (CCD) image sensor or the like may be converted into digitized form and subjected to a number of non-linear signal processes so as to generate a video signal. More specifically, in such digital video camera system, image-sensed light obtained from a subject by color image-sensing units (such as CCD image sensors or the like) may be decomposed or separated into three primary color light components, that is, a red (R) light component, a green (G) light component, and a blue (B) light component. The three primary color image-sensed signals may be converted into digital image-sensed data by an analog-to-digital (A/D) converter and supplied to a pre-process circuit, wherein pixel imperfection compensation, pixel shading compensation, and so forth may be performed. Thereafter, the three primary color image-sensed data signals may be supplied to a process circuit, wherein linear matrix processing, gamma correction, knee correction, aperture correction or the like may be performed. Such process circuit may produce brightness or luminance data and color-difference data from the processed three primary color image-sensed data signals. Such luminance data and color-difference data may be converted into analog luminance and color-difference signals by a digital-to-analog (D/A) converter. Thereafter, a composite video signal may be generated by an encoder based on such luminance signal and color-difference signal and supplied therefrom. Further, the luminance data and the color-difference data may be supplied to a rate converter circuit wherein, for example, a clock rate may be converted into a clock rate corresponding to a video tape recorder electrically connected to the video camera system. The signal having a converted rate may be recorded in the video tape recorder.

Processing operations of the pre-process circuit, the process circuit, and the rate converter circuit may be changed by varying parameters or parameter data of such circuits. As such, parameter data may be supplied to and held in the respective circuits prior to the initiation of the desired operations.

In the above-described video camera system, the pre-process circuit, the process circuit, and the rate converter circuit or the like may be respectively formed as integrated circuits. These integrated circuits may be installed on one or more printed circuit boards by a number of techniques, such as soldering. To ensure that such integrated circuits are properly installed and/or properly coupled together, such installation and coupling may be checked or confirmed. However, upon detection of a failure, the location or cause of such failure may be difficult to determined. That is, each component or integrated circuit (or its associated solder joints) along with the connections therebetween may need to be checked. Since the components or integrated circuits may be densely packaged and since the signals are processed in digitized form, it may be difficult to locate the faulty spot or spots. As a result, the time and cost to locate and repair a fault may be relatively large.

OBJECTS AND SUMMARY OF THE INVENTION

An object of the present invention is to provide an apparatus and method for performing self-diagnosing so as to enable a failure or a faulty spot(s) to be easily located.

More specifically, test pattern data is supplied from a first portion or side to a second portion or side, discrimination pattern data is generated in synchronism with the test pattern data and compared to the test pattern data on the second portion or side, whereupon a faulty spot or failure between the first and second sides may be detected based on the comparison result.

According to an aspect of the present invention, an apparatus and method for detecting a failure between a first device and a second device are provided. The apparatus comprises a first generating unit located in the first device for generating a first pattern of data and for supplying the generated first pattern of data to the second device, a second generating unit located in the second device for generating a second pattern of data synchronized with the first pattern of data supplied from the first device, a comparing unit for comparing the first and second patterns of data, and a unit for detecting a failure between the first and second devices based on the comparison result obtained by the comparing unit. The method for detecting a failure between a first device and a second device comprises corresponding steps.

The first device may be an integrated circuit and may include a test pattern generating unit for generating predetermined test pattern data and for supplying such test data at the same transmission rate as transmission data. The second device may be another integrated circuit and may include a discrimination pattern generating unit for generating discrimination pattern data synchronized with the test pattern data, a pattern comparator for comparing the test pattern data and the discrimination pattern data, and a self-diagnosing unit for detecting a failure or a faulty spot on a data transmission line between the first and second devices or integrated circuits based on the comparison result of the pattern comparator.

Therefore, in the present invention, predetermined test pattern data may be supplied at substantially the same transmission rate as transmission data from the test pattern generating unit provided on a data transmitting side (first side or device). On a data receiving side (second side or device), a discrimination pattern generating unit generates discrimination pattern data which may be identical to and in synchronism with the test pattern data supplied from the data transmitting side, and a pattern comparator compares the test pattern data and the discrimination pattern data. A failure or faulty spot between the transmitting side and the receiving side may be detected based on the result of such comparison.

Other objects, features and advantages according to the present invention will become apparent from the following detailed description of illustrated embodiments when read in connection with the accompanying drawings in which corresponding components are identified by the same reference numerals.

BRIEF DESCRIPTION OF THE DRAWINGS

FIG. 3B is a diagram of portions of the video camera system of FIG. 1;

FIGS. 9A–9T and 9A'–9T' are diagrams to which reference will be made in explaining an operation of the test pattern generator;

FIG. 14 is a diagram of test pattern data EBB2, EBR2, and EBG2;

FIG. 15 is a diagram of test pattern data EBB3, EBR3, and EBG3; and

FIG. 16 is a diagram of selected data POB through POBG.

DESCRIPTION OF PREFERRED EMBODIMENTS

Embodiments of the present invention will now be described with reference to the accompanying drawings. In such description, the present embodiments will be applied to a digital video camera system. However, the present invention is not so limited and may be applied or utilized in other systems or applications.

Figure 1:
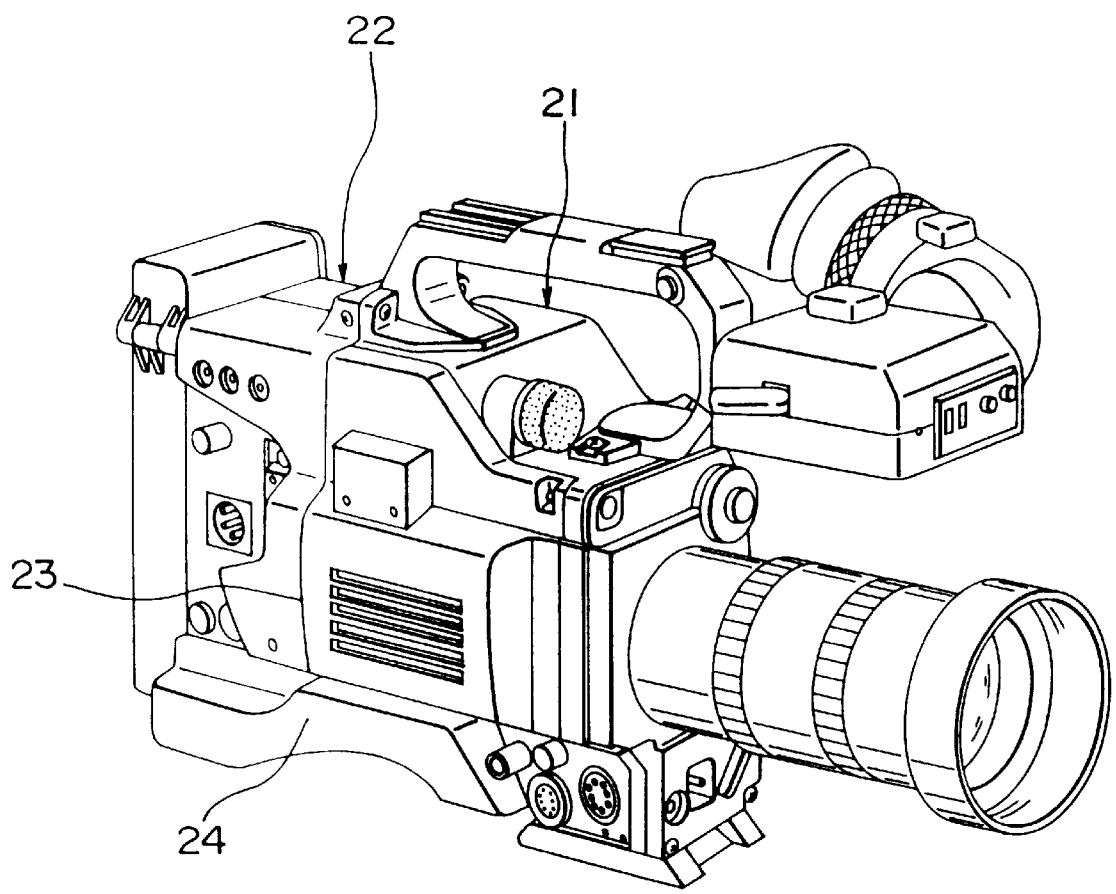
FIG. 1 is a perspective view of a video camera system.
Figure 2:
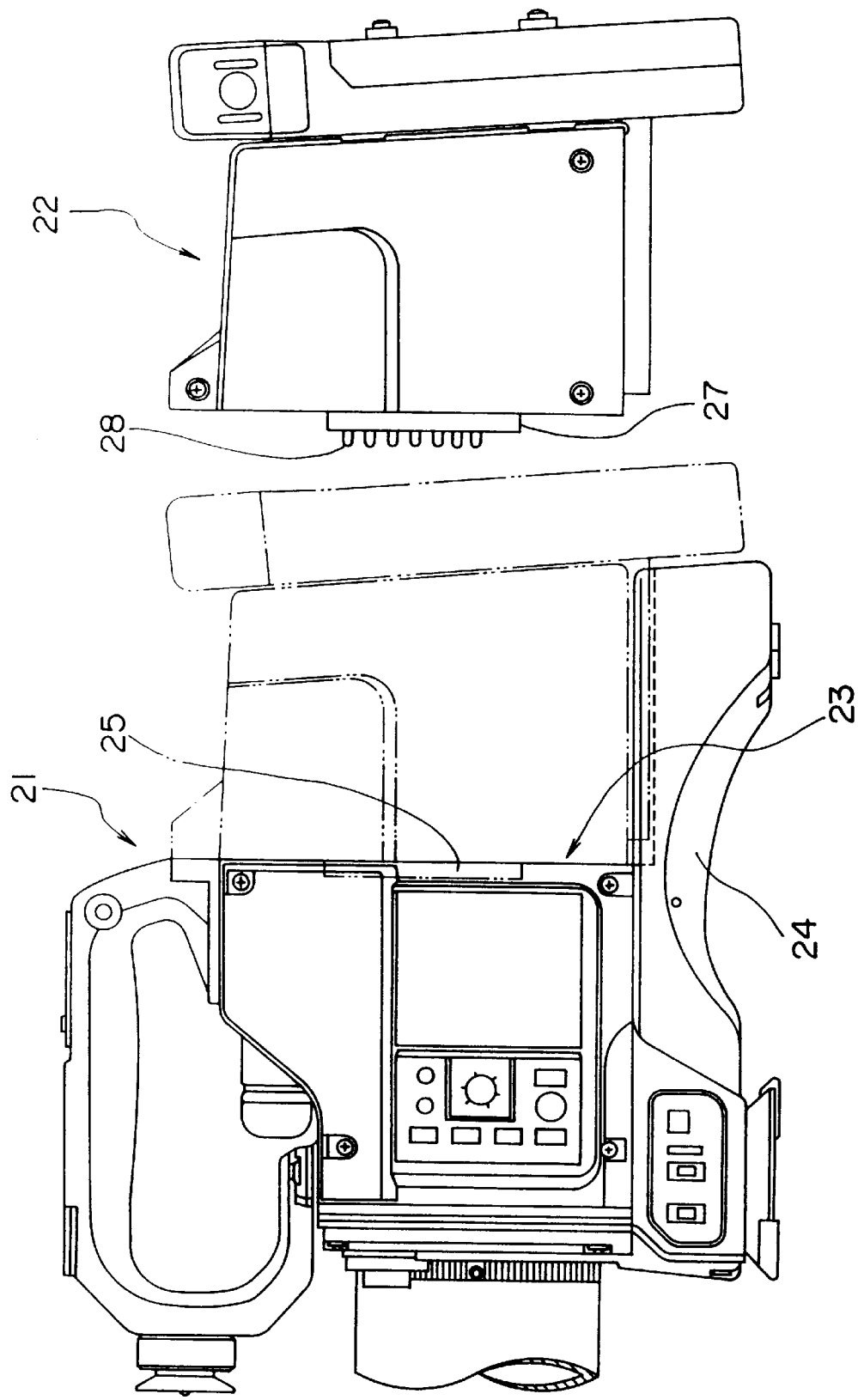
FIG. 2 is a side view of the video camera system of FIG. 1.

A video camera system which incorporates the present invention is illustrated in FIGS. 1 and 2. As shown therein, such video camera system includes a camera block 21 and a connectable member 22 coupled to the camera block. The connectable member may be a video tape recorder (VTR) block or the like. The video camera system may further include a shoulder pad 24 which is mounted to a lower portion of the camera block 21. The shoulder pad 24 may have a portion which protrudes beyond a rear surface 23 of the camera block 21 upon which the VTR block 22 is arranged on an upper surface thereof.

The VTR block 22 and the camera block 21 may be electrically coupled together by connectors or the like. For example, contact pins 28 of a male connector 27 provided on a front 26 side of the VTR block 22 may be inserted into corresponding connecting sockets or portions (not shown) of a female connector 25 provided on the rear surface 23 of the camera block 21, thereby electrically connecting the camera block 21 and the VTR block 22 together.

Figure 3A:
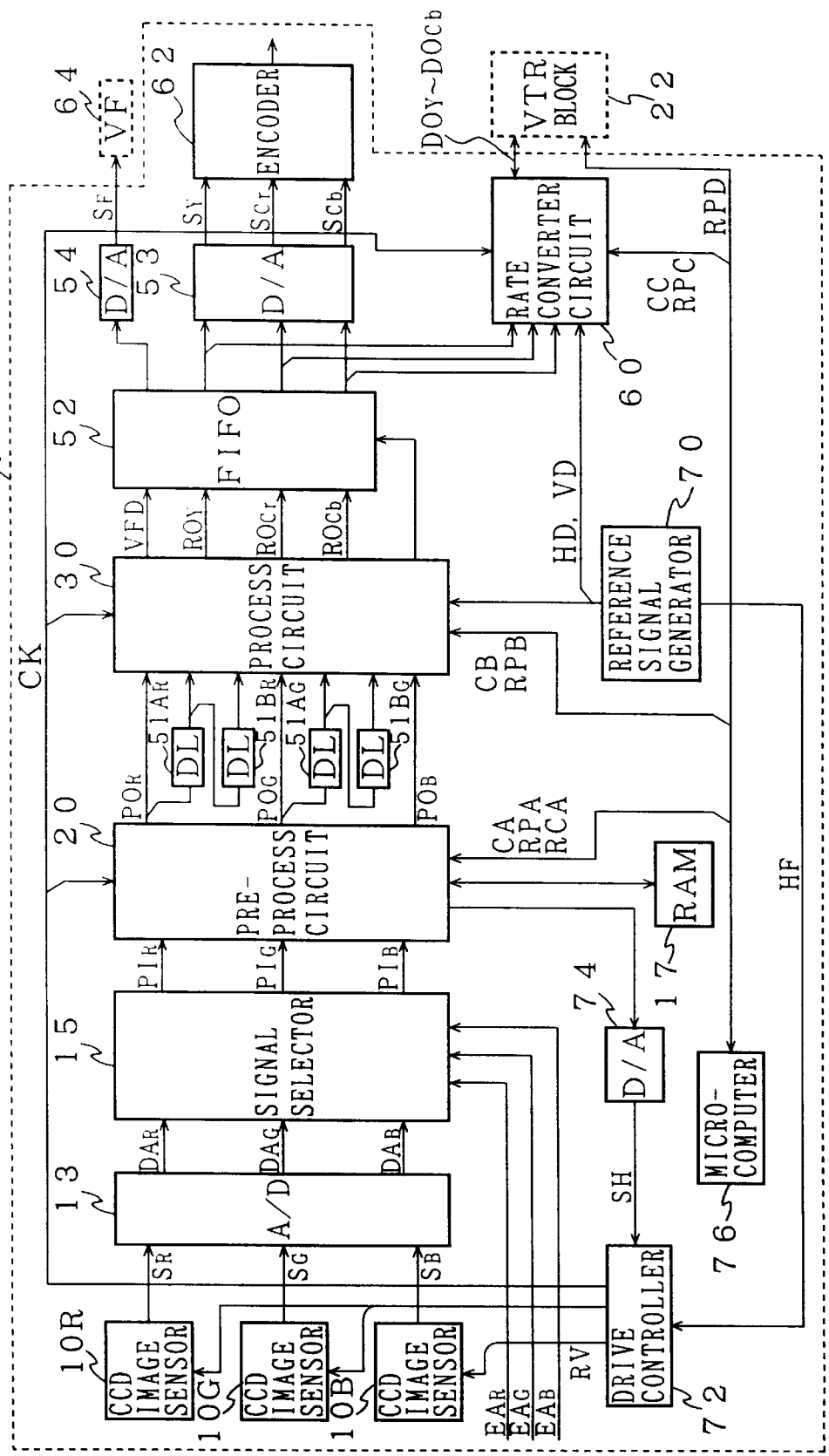
FIG. 3A is a diagram of a camera block of the video camera system of FIG. 1.

An arrangement of the camera block 21 is illustrated in FIG. 3. Such camera block includes CCD image sensors 10R, 10G, and 10B, a signal selector 15, a pre-process circuit 20, a process circuit 30, a first in first out (FIFO) unit 52, a rate converter circuit 60, an encoder 62, and a microcomputer (micon) 76, which are connected as shown in FIG. 3A.

Color image pickup units or CCD image sensors 10R, 10G, and 10B respectively supply three primary color image-sensed signals SR, SG, and SB to an analog-to-digital (A/D) converter 13 so as to be converted into digital image-sensed data DAR, DAG, and DAB which, in turn, are supplied to the signal selector 15. The signal selector 15 may further receive test pattern data EAR, EAG, and EAB from an operation checking jig 200 (hereinafter more fully described) which may be electrically connected to the signal selector 15 upon operation of the video camera system. The signal selector 15 selects the image-sensed data DAR, DAG, and DAB or the test pattern data EAR, EAG, and EAB and supplies the same as selected data PIR, PIG, and PIB to the pre-process circuit 20.

Figure 4:
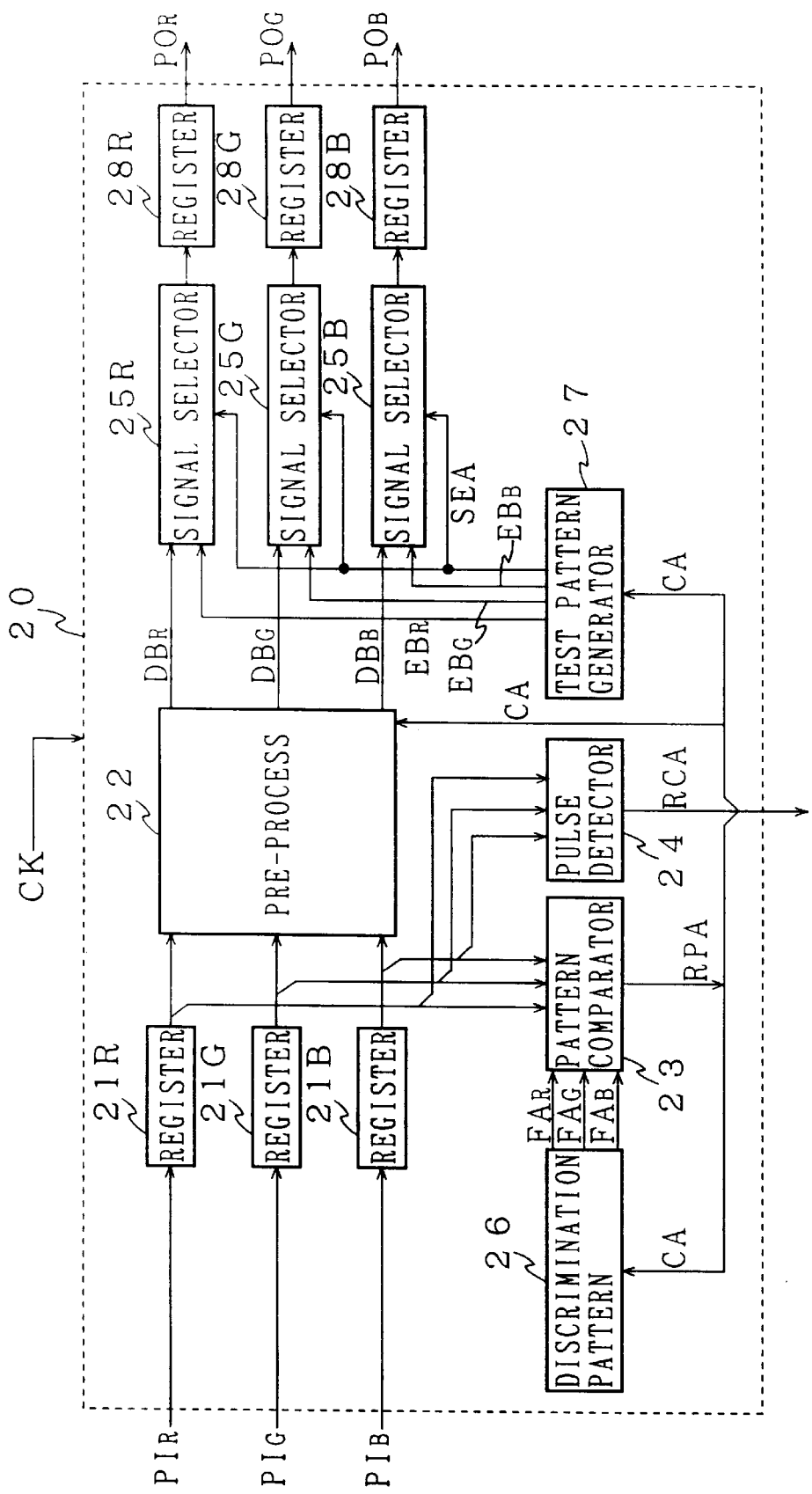
FIG. 4 is a diagram of a pre-process circuit of the camera block of FIG. 3A.

As shown in FIG. 4, the selected data PIR, PIG, and PIB from the signal selector 15 may be respectively supplied through registers 21R, 21G, and 21B to a pre-process signal processor 22, a pattern comparator 23, and a pulse detector 24 of the preprocess circuit 20.

When the selected data PIR, PIG, and PIE are the image-sensed data DAR, DAG, and DAB, the pre-process signal processor 22 may subject such data to predetermined processing such as pixel imperfection compensation, pixel shading compensation, and so forth. Such processing (that is, the imperfection compensation, the shading compensation and so forth) may be performed by utilizing a RAM 17 which is connected to the pre-process circuit 20 as shown in FIG. 3A. The processed data PIR, PIG, and PIB from the pre-process signal processor 22 may be respectively supplied as three primary color image-sensed data DBR, DBG, and DBB to signal selectors 25R, 25G, and 25B. Further, the pulse detector 24 may determine whether pulses exist for the selected data PIR, PIG, and PIB, and may supply the result of such determination as an output signal RCA to the microcomputer 76.

When the selected data PIR, PIG, and PIB are the test pattern data EAR, EAG, and EAB, the discrimination pattern generator 26 may produce discrimination pattern data FAR, FAG, and FAB in synchronism with the test pattern data EAR, EAG, and EAB in accordance with a control signal CA supplied from the microcomputer 76. The produced discrimination pattern data FAR, FAG, and FAB and the selected data PIR, PIG, and PIB (which is the test pattern data EAR, EAG, and EAB) are supplied to the pattern comparator 23. The pattern comparator 23 compares the discrimination pattern data FAR, FAG, and FAB with the selected data PIR, PIG, and PIB so as to form a comparison signal RPA for supply to the microcomputer 76.

Further, the test pattern generator 27 may produce test pattern data EBR, EBG, and EBB in accordance with the control signal CA supplied from the microcomputer 76 and may respectively supply the same to signal selectors 25R, 25G, and 25B. Additionally, the test pattern generator 27 may generate a select signal SEA in accordance with the control signal CA and may supply the same to the signal selectors 25R, 25G, and 25B. In response to the select signal SEA, the signal selectors 25R, 25G, and 25B respectively select any of the three primary color image-sensed data DBR, DBG, and DBB or the test pattern data EBR, EBG, and EBB and supply the selected data through registers 28R, 28G, and 28B to the process circuit 30 as selected data POR, POG, and POB. Additionally, a number of such selected data signals may be delayed by a predetermined amount and supplied to the process circuit 30. For example, as shown in FIG. 3A, the selected data POR may be delayed by one horizontal scanning period by a delayer 51AR and supplied to the process circuit 30. Such delayed data POR may be further delayed by another horizontal scanning period by a delayer 51BR and supplied to the process circuit 30. Similarly, the selected data POG may be delayed by one horizontal scanning period by a delayer 51AG and supplied to the process circuit 30, and the delayed data POG may be further delayed by another horizontal scanning period by a delayer 51BG and supplied to the process circuit 30.

Figure 5:
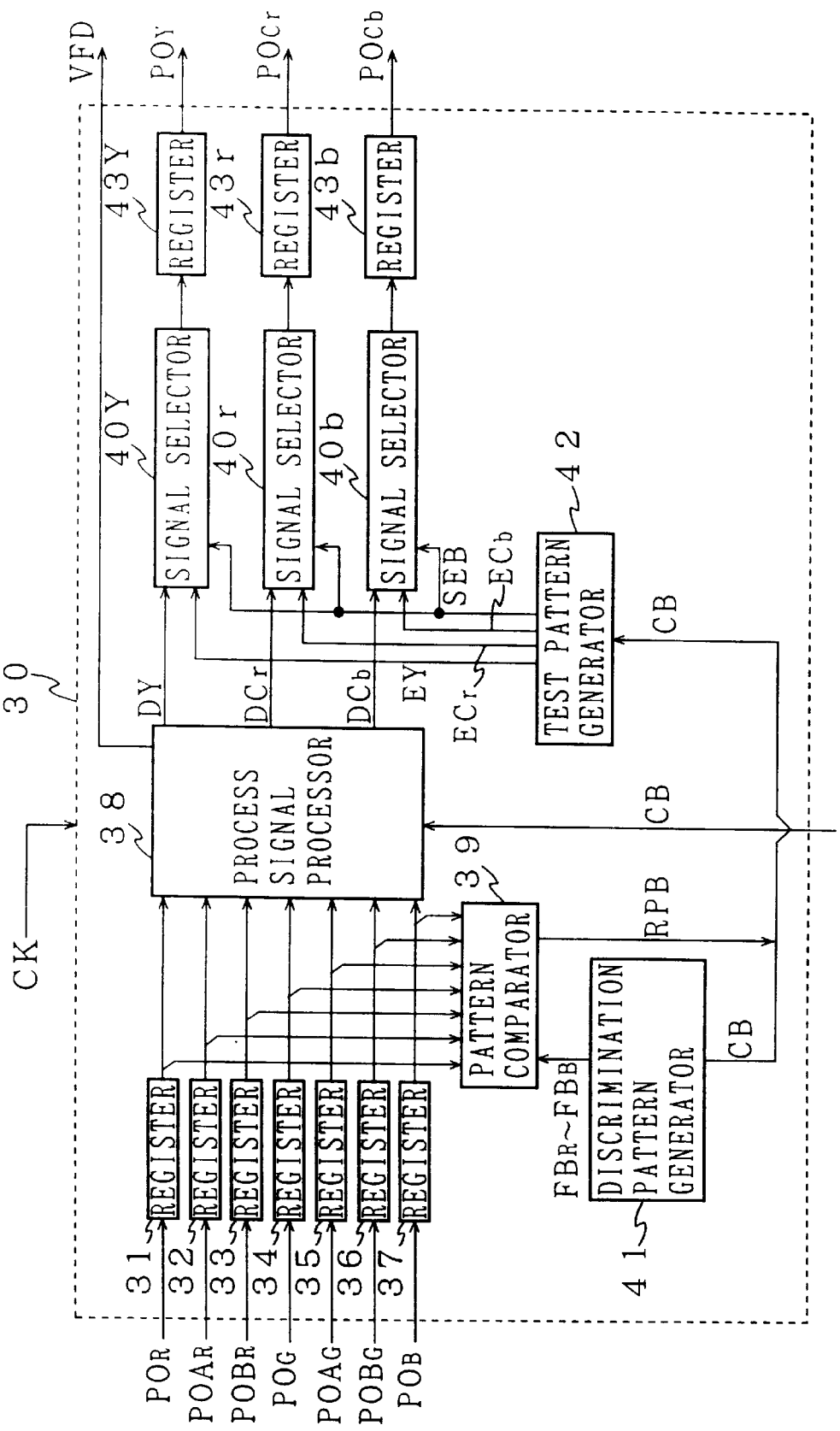
FIG. 5 is a diagram of a process circuit of the camera block of FIG. 3A.

As shown in FIG. 5, the selected data and the delayed data from the pre-process circuit 20 are supplied through registers 31–37 to a process signal processor 38 and a pattern comparator 39 of the process circuit 30. More specifically, the selected data POR is supplied through the register 31 to the process signal processor 38 and the pattern comparator 39, the selected delayed data POAR (which was delayed by the delayer 51AR) is supplied through the register 32 to the process signal processor 38 and the pattern comparator 39, the selected delayed data POBR (which was delayed by the delayer 51BR) is supplied through the register 33 to the process signal processor 38 and the pattern comparator 39, the selected data POG is supplied through the register 34 to the process signal processor 38 and the pattern comparator 39, the selected delayed data POAG (which was delayed by the delayer 51AG) is supplied through the register 35 to the process signal processor 38 and the pattern comparator 39, the selected delayed data POBG (which was delayed by the delayer 51BG) is supplied through the register 36 to the process signal processor 38 and the pattern comparator 39, and the selected data POB is supplied through the register 37 to the process signal processor 38 and the pattern comparator 39.

The process signal processor 38 may subject the received data POR, POAR, POBR, POG, POAG, POBG, and POB to predetermined processing (such as linear matrix processing, gamma correction or control, knee correction, aperture correction or the like) and may produce brightness or luminance data DY and color-difference data DCr and DCb by a YC matrix process which are respectively supplied to selectors 40Y, 40r, and 40b. Further, the process signal processor 38 may generate viewfinder data VFD and supply the same to the FIFO unit 52 (FIG. 3A).

A discrimination pattern generator 41 may produce discrimination pattern data FBR, FBAR, FBBR, FBG, FBAG, FBBG, and FBB in synchronism with the data POR, POAR, POBR, POG, POAG, POBG, and POB in accordance with a control signal CB supplied from the microcomputer 76. The produced discrimination pattern data FBR, FBAR, FBBR, FBG, FBAG, FBBG, and FBB is supplied to the pattern comparator 39 which, as previously described, also receives the selected data POR, POAR, POER, POG, POAG, POBG and POB. The pattern comparator 39 compares the discrimination pattern data FBR, FBAR, FBBR, FBG, FBAG, FBBG, and FBB with the selected data POR, POAR, POBR, POG, POAG, POBG and POP so as to form a comparison signal RPB for supply to the microcomputer 76.

A test pattern generator 42 may generate test pattern data EY, ECr, and ECb in accordance with the control signal CB supplied from the microcomputer 76 and may respectively supply the same to the signal selectors 40Y, 40r, and 40b. Additionally, the test pattern generator 42 may generate a select signal SEB in accordance with the control signal CB and may supply the same to the signal selectors 40Y, 40r, and 40b. In response to the select signal SEB, the signal selectors 40Y, 40r, and 40b respectively select any of the luminance data DY and the color-difference data DCr and DCb or the test pattern data EY, ECr, and ECb and supply the selected data through registers 43Y, 43r, and 43b to the FIFO unit 52 (FIG. 3A) as selected data ROY, ROCr, and ROCb.

Returning to FIG. 3A, the FIFO unit 52 may receive the viewfinder data VFD and the selected data ROY, ROCr, and ROCb from the process circuit 30 and may subject the same to so-called cut-out control or the like. As an example, data may be processed or cut out from the selected data ROY, ROCr, and ROCb so as to change the aspect ratio of a displayed image, such as from 16:9 to 4:3.

The cut-out viewfinder data VFD may be supplied from the FIFO 52 to a digital-to-analog (D/A) converter 54 so as to be converted into an analog viewfinder signal SF. Such viewfinder signal SF may be supplied to a viewfinder 64, whereupon a photographed image or the like corresponding thereto may be displayed.

The cut-out data ROY, ROCr, and ROCb may be supplied to a digital-to-analog (D/A) converter 53 wherein such data may be converted into an analog luminance signal SY and analog color-difference signals SCr and SCb which, in turn, may be supplied to an encoder 62. In accordance with the luminance signal SY and the color-difference signals SCr and SCb, the encoder 62 generates a video signal SV and supplies the same therefrom.

As shown in FIGS. 3A and 3B, the cut-out data ROY, ROCr, and ROCb may be further supplied to a rate converter device 400 in a rate converter circuit 60, wherein the clock rate of such data may be converted into a predetermined rate. For example, the converter circuit 60 may convert the clock rate of the selected data ROY, ROCr and ROCb into a clock rate corresponding to the VTR block 22 and supply image clock rate converted data DOY, DOCr and DOCb through a selector 402 to the VTR block 22. Further, the rate converter circuit 60 may include a discrimination pattern generator 404 and a pattern comparator 406 which operate in a manner similar to those of the pre-process circuit 20 and the process circuit 30. That is, the pattern comparator 406 in the rate converter circuit 60 receives discrimination data produced from the discrimination pattern generator 404 of the rate converter circuit 60 and the test pattern data supplied from the process circuit 30 through the FIFO unit 52 and compares such received data so as to form a comparison signal RPC which is supplied through a bus to the microcomputer 76. The rate converter circuit 60 may further include a test pattern generator 408 for generating test pattern data in a manner similar to that of previously described test pattern generators 27 and 42. Test pattern data from the test pattern generator 408 of the rate converter circuit 60 may be supplied through the selector 402 to the VTR block 22 along with the image rate converted data DOY, DOCr, and DOCb. The operation of the rate converter circuit 60 may be controlled in accordance with a control signal CC supplied from the microcomputer 76.

The VTR block 22 may include a recorder/reproducer 424 for performing recording and/or reproducing operations. The VTR block 22 may further include a discrimination pattern generator 420 and a pattern comparator 422 which are similar to and operate in a similar manner to the discrimination pattern generators 26 and 41 and the pattern comparators 23 and 39 previously described. Data produced from the discrimination pattern generator 420 of the VTR block 22 may be compared with the test pattern data supplied from the rate converter circuit 60 so as to form a comparison signal RPD which is supplied to the microcomputer 76. As a result, it may be determined whether a failure has occurred.

The microcomputer 76 may generate control signals CA, CB, and CC and respectively supply such signals to the pre-process circuit 20, the process circuit 30, and the rate converter circuit 60 so as to control the operation of the same. Further, based on the comparisons results RPA, RPB, RPC, and RPD from the pre-process circuit 20, the process circuit 30, the rate converter circuit 60, and the VTR block 22 and the determination result RCA from the pulse detector 24, the microcomputer 76 may determine whether the respective circuits and the VTR block are properly connected or whether a failure therebetween has occurred.

A reference signal generator 70 may generate a reference signal HF and supply the same to a drive controller 72. The reference signal generator 70 may further generate a horizontal synchronizing signal HD and a vertical synchronizing signal VD or the like and supply the same to the process circuit 30 and the rate converter circuit 60 to enable signal processing to be performed at a predetermined time.

Further, shading compensation data calculated by the pre-process circuit 20 may be supplied to a digital-to-analog (D/A) converter 74 so as to be converted into an analog shading compensation signal SH which may be supplied to the drive controller 72. In accordance with the shading compensation signal SH and the reference signal HF from the reference signal generator 70, the drive controller 72 may generate a drive signal RV and supply the same to the CCD image sensors 10R, 10G, and 10B. As a result, shading which may otherwise be associated with each of the image-sensed signals SR, SG, and SB may be reduced. The drive controller 72 may further generate a clock signal CK synchronized with the reference signal HF and may supply the same to the pre-process circuit 20, the process circuit 30, the rate converter 60, and other desired circuits. As a result, each such circuit may perform signal processing in synchronism with the clock signal CK.

Figure 6:
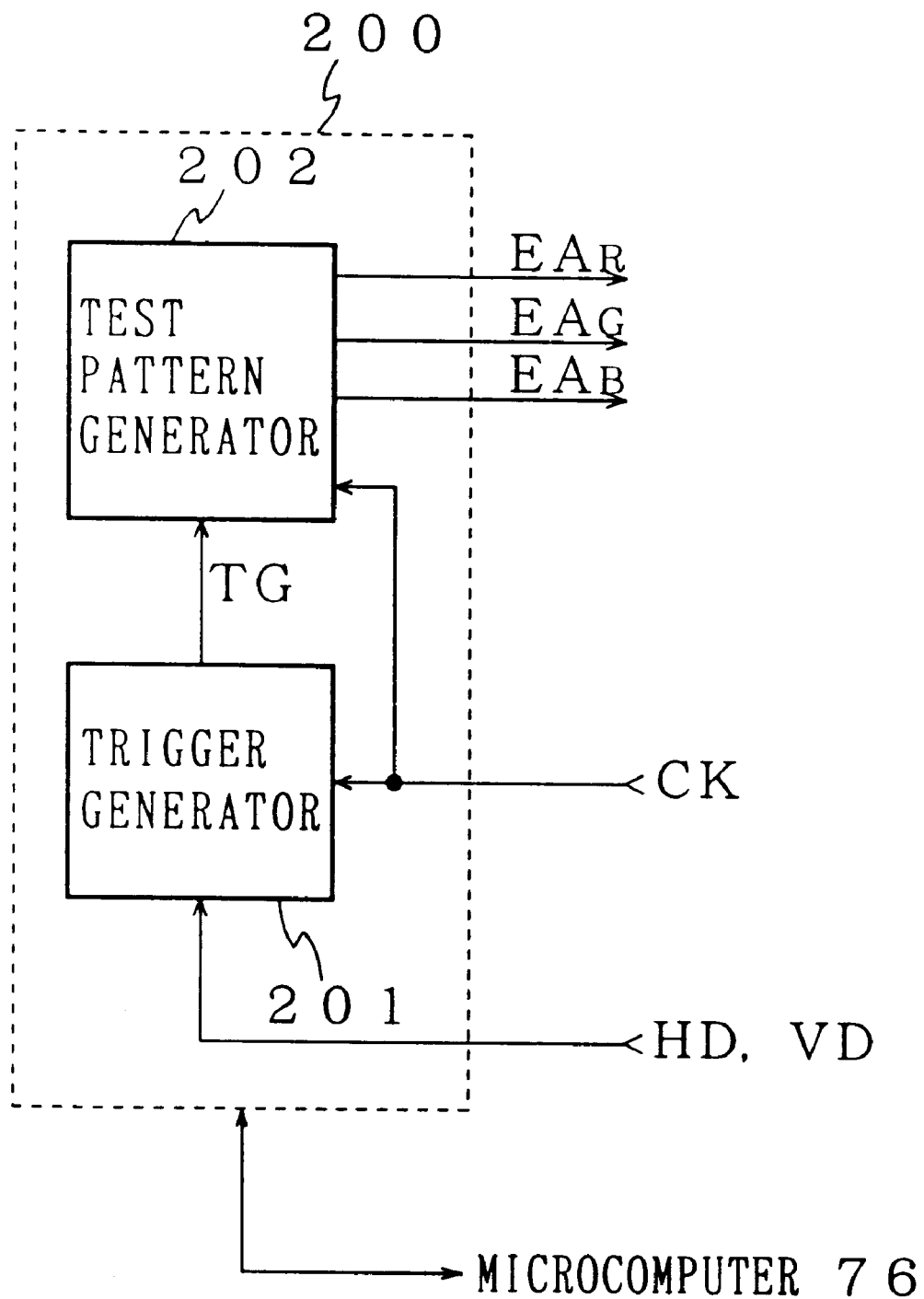
FIG. 6 is a diagram of a jig for generating test pattern data.

As previously described, test pattern data EAR, EAG, and EAB may be generated by the operation checking jig 200 and supplied to the signal selector 15. Such operation checking jig 200 is illustrated in FIG. 6. As shown therein, the operation checking jig 200 includes a trigger generator 201 and a test pattern generator 202, in which the trigger generator 201 receives the horizontal synchronizing signal HD and the vertical synchronizing signal VD from the reference signal generator 70 and the clock signal CK from the drive controller 72 and in which the test pattern generator 202 also receives the clock signal CK from the drive controller 72. The trigger generator 201 may generate a trigger signal TG in predetermined timing based on the horizontal synchronizing signal HD, the vertical synchronizing signal VD, and the clock signal CK and may supply the same to the test pattern generator 202. The test pattern generator 202 may produce the test pattern data EAR, EAG, and EAB in accordance with the trigger signal TG and may supply such data to the signal selector 15 based on the clock signal CK. Further, the operation checking jig 200 may be coupled to the microcomputer 76 so as to enable communication therebetween. For example, the microcomputer 76 may supply control signals to the operation checking jig 200 so as to control the operation thereof.

Figure 7:
FIGS. 7A–7I are timing diagrams to which reference will be made in describing a self-diagnosing operation.

The timing arrangement utilized in outputting generated test pattern data in the present apparatus is illustrated in FIG. 7. That is, FIG. 7A illustrates a vertical synchronizing pulse VD, FIG. 7B illustrates a horizontal synchronizing pulse HD, FIG. 7C illustrates red image-sensed data DAR, FIG. 7D illustrates green image-sensed data DAG, FIG. 7E illustrates blue image-sensed data DAB, and FIGS. 7F through 7I respectively illustrate a horizontal synchronizing pulse HD and image-sensed data DAR, DAG and DAB for the next field. The numbers designated at the horizontal synchronizing pulses HD represent horizontal scanning lines. The three primary color image-sensed data DAR, DAG, and DAB respectively indicate horizontal line numbers for pixels of the CCD image sensors 10R, 10G, and 10B.

The signal selectors 25R, 25G, 25B (FIG. 4) and the signal selectors 40Y, 40r, 40b (FIG. 5) respectively select the test pattern data EBR, EBG, EBB and EY, ECr, ECb during a period in which the image-sensed data DAR, DAG, and DAB have a vertical optical black level (VOPB), such as during the 15th and 277th horizontal scanning lines, and supply the selected data to the next-stage circuits. (Vertical optical black may, for example, be obtained as an output of photo sensors which are shielded to prevent light incident thereon and which outputted during a vertical blanking period. In this regard, U.S. Pat. No. 4,553,169 is hereby incorporated by reference.) By supplying the test pattern data (which may be utilized for detecting failures) during the period in which the image-sensed data DAR, DAG, and DAB have an optical black level, the test pattern data may be supplied or transmitted without adversely affecting a displayed image. Similarly, the signal selector 15 may select the test pattern data EAR, EAG, and EAB supplied from the test pattern generator 202 of the operation checking jig 200 during the 15th and 277th horizontal scanning lines.

An example of a test pattern generator (such as the test pattern generator 27 or 42) will now be described.

Figure 8:
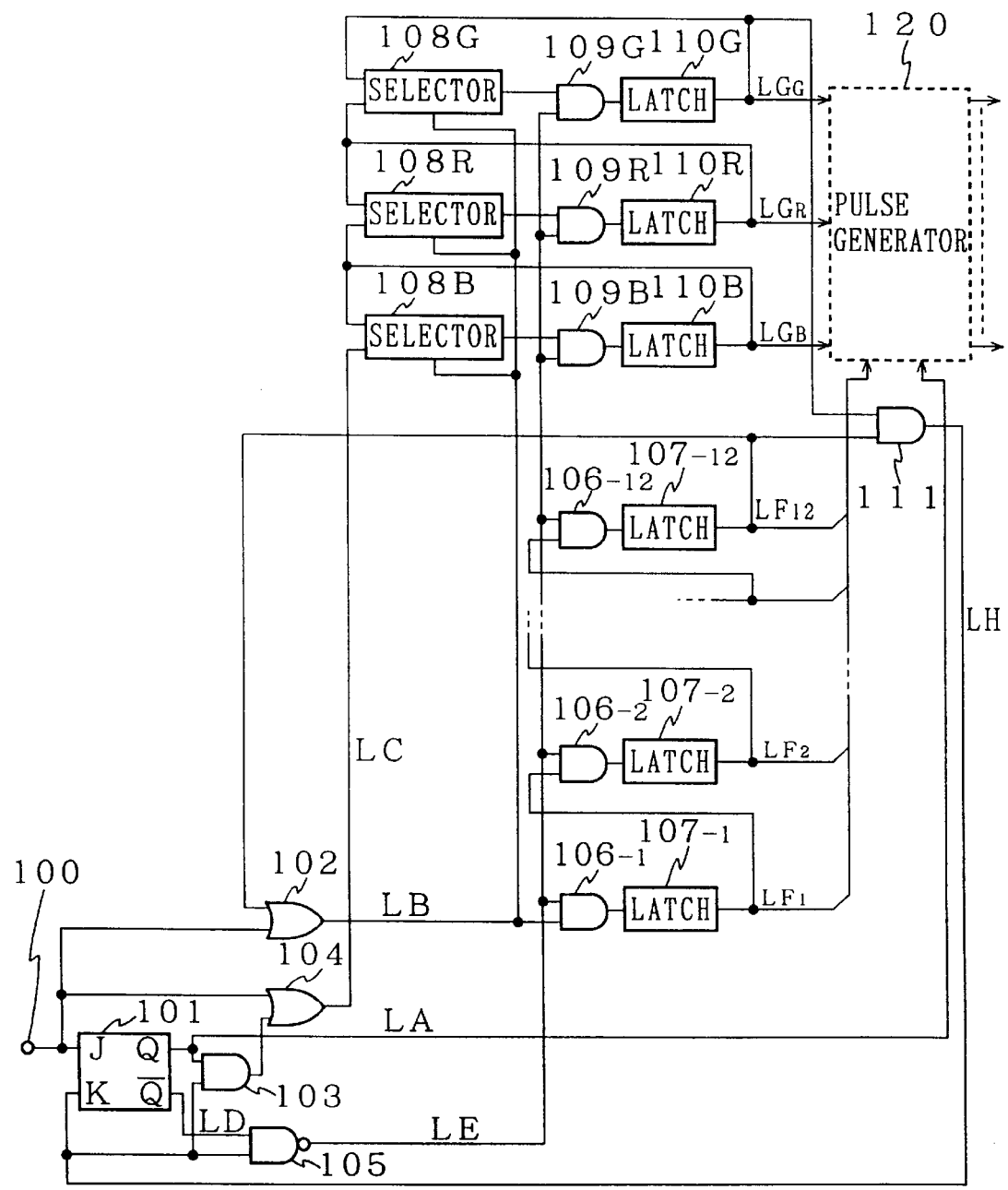
FIG. 8 is a diagram of a test pattern generator.

As shown in FIG. 8, the test pattern generator may include a J–K flip-flop 101, OR gates 102 and 104, NAND gate 105, AND gates 103, 106-1 to 106-12, 109B, 109R, 109G, and 111, selectors 108G, 108R, and 108B, and latches 110G, 110R, 110B, and 107-1 to 107-12.

A trigger signal input terminal 100 is coupled to a J input terminal of the J–K flip flop 101 and one input terminal of each OR gate 102 and 104. An output terminal of the OR gate 102 is coupled to an input terminal of the AND gate 106-1 and to the selectors 108B, 108R, and 108G. A K input terminal of the J–K flip flop 101 is coupled to an output terminal of the AND gate 111 and one input terminal of an AND gate 103 and a NAND gate 105. A Q output terminal of the J–K flip flop 101 is coupled to the other input terminal of the AND gate 103 and an output terminal thereof is coupled to the other input terminal of the OR gate 104. An output terminal of the OR gate 104 is coupled to the selector 108B. A Q output terminal of the J–K flip flop 101 is coupled to the other input terminal of the NAND gate 105 and an output terminal thereof is coupled to an input terminal of each of the AND gates 106-1 to 106-12, 109B, 109R, and 109G. The remaining connections between the latches, selectors, gates, and other elements are as shown in FIG. 8.

Figure 11:
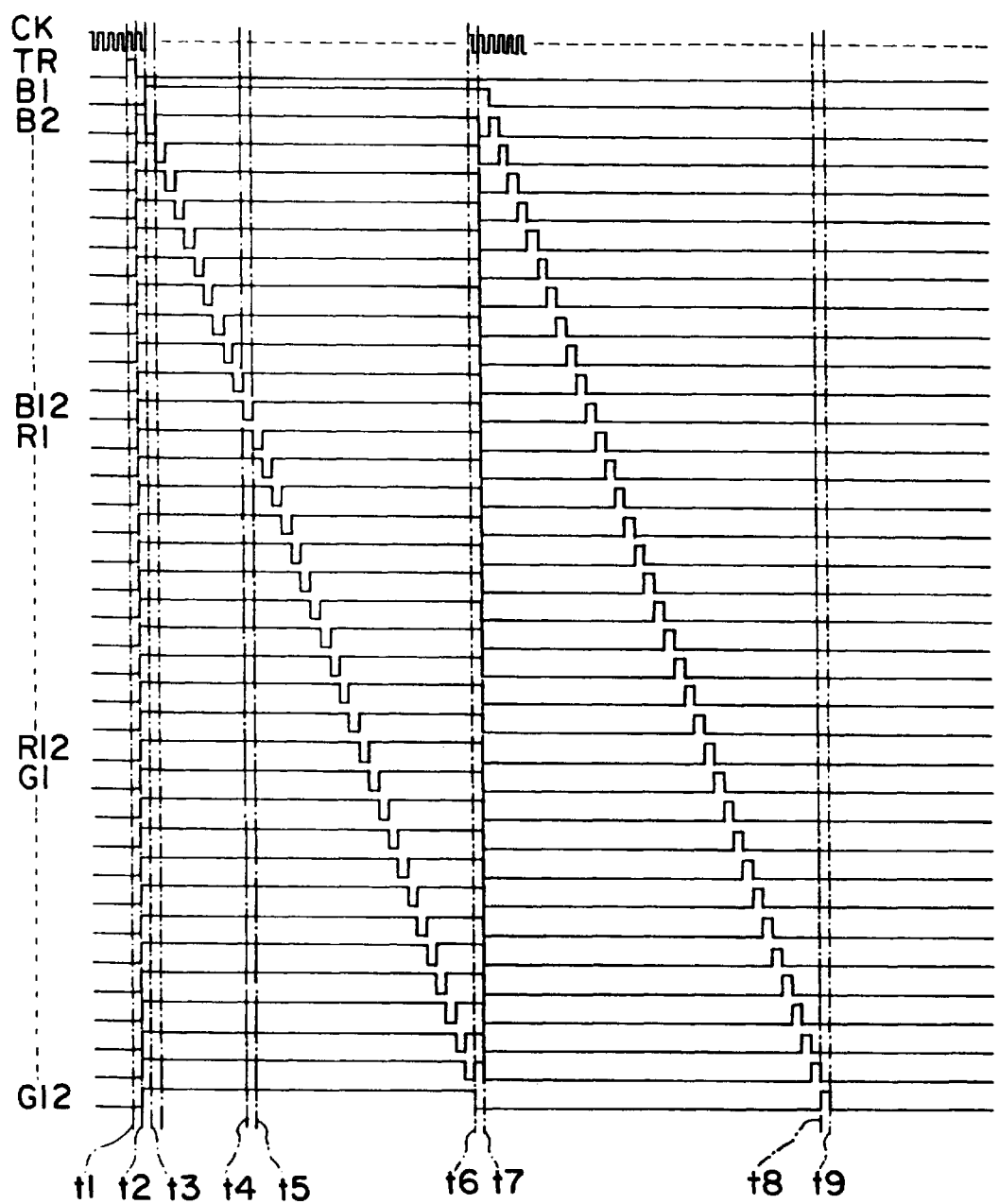
FIG. 11 is a diagram to which reference will be made in explaining an operation of the test pattern generator.

When a trigger signal TR (such as a positive pulse) is supplied from the microcomputer 76 to the trigger signal input terminal 100 at a time t1 as shown in FIGS. 9B and 11 during the period in which the image-sensed data DAR, DAG, and DAB have an optical black level (VOPB), an output signal LB (FIG. 9C) from the OR gate 102 may have a relatively high level H (such as 1). Further, in such initial state, output signals from the latches 107-1 through 107-12, 110R, 110G and 110B (see FIGS. 9E–9S) and an output signal LH from the AND gate 111 may have a low level L (such as 0). The output signal LH from the AND gate 111 (which has a low level L) is supplied to the K input terminal of the J–K flip flop 101 and one input terminal of the NAND gate 105. As a result, an output signal LE (FIG. 9D) from the NAND gate 105 has a high level H, whereupon an output signal from the AND gate 1061 has a high level H. Furthermore, when the output signal LB of the OR gate 102 has a high level H, the selector 108B may select the output signal LC from the OR gate 104 (which has a high level H) and supplies the same to an input of the AND gate 109B. The other input terminal of the AND gate 109B receives the output LE signal from the NAND gate 105 (which has a high level H). As a result, an output signal of the AND gate 109B has a high level H. Additionally, the selector 108R may select an output signal LGB from the latch 110B (which has a low level L), and the selector 108G may select an output signal LGR from the latch 110R (which has a low level L).

Therefore, the output signal LF1 from the latch 107-1, the output signal LGB from the latch 110B, and the output signal LA from the output terminal Q of the J–K flip flop 101 have a high level H at the time t2 or at the leading edge of the next clock pulse CK as shown in FIGS. 9E, 9Q, and 9T. Thereafter, the output signal LB from the OR gate 102 is rendered low. As a result, the selector 108B may select an output signal LGB from the latch 110B, the selector 108R may select an output signal LGR from the latch 110R, and the selector 108G may select an output signal LGG from the latch 110G.

Figure 10:
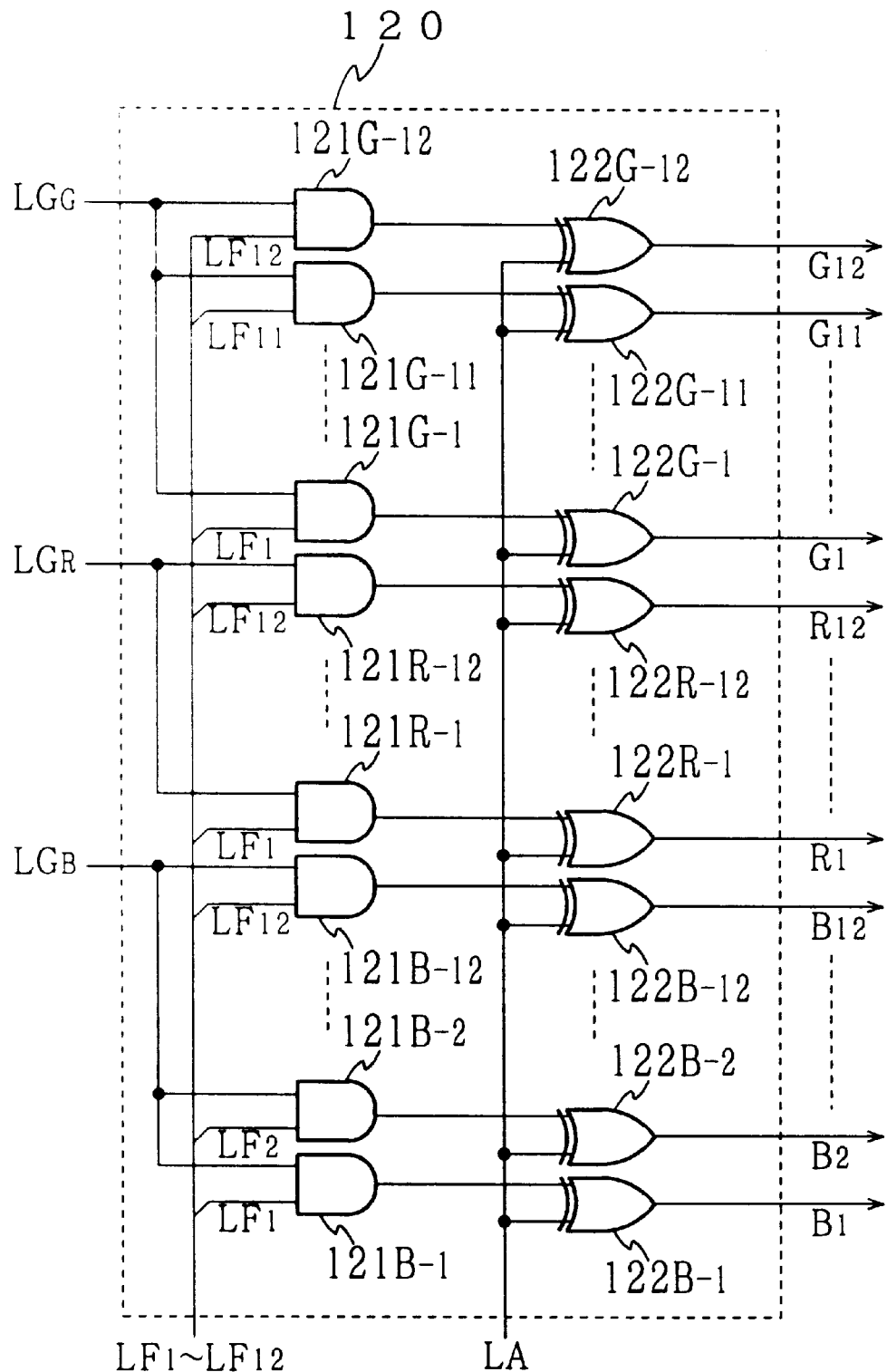
FIG. 10 is a diagram of a pulse generator.

Furthermore, the respective output signals of the latches 107-1 through 107-12, 110R, 110G, and 110B and the output signal LA of the J–K flip flop 101 are supplied to a pulse generator 120. Such pulse generator is further illustrated in FIG. 10. As shown therein, the output signal LF1 from the latch 107-1 is supplied to an input terminal of each of the AND gates 121B-1, 121R-1, and 121G-1; the output signal LF2 from the latch 107-2 is supplied to an input terminal of each of the AND gates 121B-2, 121R-2 and 121G-2; and the output signals LF3 through LF12 from the latches 107-3 through 107-12 are similarly supplied 15 to input terminals of the corresponding AND gates 121B-3 through 121B-12, 121R-3 through 121R-12, and 121G-3 through 121G-12. Further, the output signal LGB from the latch 110B is supplied to an input terminal of each of the AND gates 121B-1 through 121B-12; the output signal LGR from the latch 110R is supplied to an input terminal of each of the AND gates 121R-1 through 121R-12; and the output signal LGG from the latch 110G is supplied to an input terminal of each of the AND gates 121G-1 through 121G-12. Furthermore, output signals from the AND gates 121B-1 through 121B-12, 121R-1 through 121R-12, and 121G-1 through 121G-12 are respectively supplied to an input terminal of the Exclusive-OR (XOR) gates 122B-1 to 122B-12, 122R-1 to 122R-12, and 12G-1 to 122G-12. The LA signal from the Q output terminal of the J–K flip flop 101 is supplied to another input terminal of each of the XOR gates 122B-1 to 122B-12, 122R-1 to 122R-12, and 12G-1 to 122G-12.

If the output signal LF1 from the latch 107-1 and the output signal LGB from the latch 110B each have a high level H, such as at time t2 (see FIGS. 9E and 9Q), the output signal from the AND gate 121B-1 has a high level H which is supplied to one input of the XOR gate 122B-1. If, at such time t2, the output signal LA from the J–K flip flop 101 has a high level H (see FIG. 9T), an output signal B1 from the XOR gate 122B-1 has a low level L as shown in FIG. 11. Further, at time t2, the output signals LF2-LF12, LGR, and LGG are low (see FIGS. 9F–9P, 9R and 9S). As a result, the output signals of the AND gates 121B-2 through 121B-12, 121R-1 through 121R-12, and 121G-1 through 121G-12 each have a low level and, as such, the output signals B2–B12, R1–R12, and G1–G12 respectively produced from the XOR gates 122B-2 through 122B-12, 122R-1 through 122R-12, and 122G-1 through 122-G12 each have a high H level as shown in FIG. 11.

Further, at time t2, since the output signal LF1 from the latch 107-1 (FIG. 8) and the output signal LE from the NAND gate 105 each have a high H level, the output signal from the AND gate 106-2 is rendered high. Additionally, the output signal LB from the OR gate 102 is brought to a low level and, as a result, the output signal from the AND gate 106-1 is also brought to a low level. As such, at time t3 (or the leading edge of the next clock CK pulse), the output signal LF2 from the latch 107-2 is brought to a high level H and the output signal LF1 from the latch 107-1 is rendered low as shown in FIGS. 9E and 9F. As a result, at time t3, only the output signal of the AND gate 121B-2 (FIG. 10) is rendered high in level and only the output signal B2 of the XOR gate 122B-2 (FIG. 10) is rendered low in level as shown in FIG. 11.

Processing similar to that described above continues. At a time t4, the output signal LF12 of the latch 107-12 is brought to a high level (as shown in FIG. 9P) and, as a result, the output signal LB of the OR gate 102 is rendered high (as shown in FIG. 9C). As such, the selector 108B may select the output LC signal from the OR gate 104 which has a low level, whereupon the output signal of the AND gate 109B is brought to a low level; and the selector 108R may select the output signal LGB from the latch 110B which has a high level (see FIG. 9Q), whereupon the output signal of the AND gate 109R is rendered high. Further, since the output signal LB of the OR gate 102 and the output signal LE from the NAND gate 105 each have a high H level, the output signal of the AND gate 106-1 is rendered high. Therefore, at time t5 (or the next rising edge of the clock signal CK), only the output signal LF1 from the latch 107-1 and the output signal LGR from the latch 110R are rendered high (FIGS. 9E and 9R) and only the output signal R1 of the XOR gate 122R1 (FIG. 10) is brought to a low level as shown in FIG. 11.

Processing similar to that described above continues. At time t6, the output signal LF12 from the latch 107-12 and the output signal LGG of the latch 110G each have a high level (FIGS. 9P and 9S) and, as a result, the output signal G12 from the XOR gate 122G-12 is brought to a low level and the output signal LH from the AND gate 111 is rendered high. Since the output signal LF12 is high, the output signal LB from the OR gate 102 is brought to the high level and, as a result, the selector 108B may select the output signal LC from the OR gate 104. Such output signal LC has a high level because the output signal from the AND gate 103 has a high level which, in turn, is due to the output signal LA of the J–K flip flop 101 and the output signal LH of the AND gate 111 each having a high level. Furthermore, since the output signal LD of the J–K flip flop 101 has a low level, the output signal LE of the NAND gate 105 has a high level regardless of the output signal LH from the AND gate 111. As such, since the output signal LE and the output signal LB each have a high level, the output signal of the AND gate 106-1 is high.

At time t7 (or the next leading edge of the clock signal CK), the output signal LA of the J–K flip flop 101 is rendered low (FIG. 9T) and only the output signal LF1 from the latch 107-1 and the output signal LGB of the latch 110B are respectively brought to the high level "H" (see FIGS. 9E and 9Q). Further, the output signal LH from the AND gate 111 is rendered low. As such, even if the output signal LD from the J–K flip flop 101 is brought to a high level, the output signal LE of the NAND gate 105 would be maintained at its high level.

At time t7, only the output signal LF1 from the latch 107-1 and the output signal LGB from the latch 110B are rendered high (see FIGS. 9E and 9Q). As a result, only the output signal from the AND gate 121B-1 (FIG. 10) has a high level. Since only the output signal from the AND gate 121B-1 is high and since the output signal LA from the J–K flip flop 101 (which is supplied to the XOR gates 122B-1 through 122B-12, 122R-1 through 122R-12, and 122G-1 through 122G-12) is low, only the output signal B1 of the XOR gate 122B-1 is rendered high and the other output signals B2–B12, R1–R12, and G1–G12 of the XOR gates 122B-2 through 122B-12, 122R-1 through 122R-12, and 122G-1 through 122G-12 are brought to a low level at time t7 as shown in FIG. 11.

Thereafter, processing continues in a manner similar to that described above. That is, as shown in FIG. 11, the output signals B2–B12, R1–R12, and G1–G12 from the XOR gates 122B-2 through 122B-12, 122R-1 through 122R-12, and 122G-1 through 122G-12 are successively switched to a high level. At time t8, the output signal LF12 from the latch 107-12 and the output signal LGG of the latch 110G have a high level (see FIGS. 9P' and 9S') and, as a result, the output signal LH of the AND gate 111 has a high level. (FIGS. 9A'–9T' are a continuation of FIGS. 9A–9T along a time axis.) Further, at this time, since the output signal LH of the AND gate 111 is high and the output signal LD from the J–K flip flop 101 is also high, the output signal LE of the NAND gate 105 is brought to a low level (see FIG. 9D'). As a result, the output signal from the AND gate 106-1 is rendered low such that at the next rising edge of the clock signal CK, or at time t9, all of the output signals LF1–LF12 from the latches 107-1 through 107-12 and the output signals LGB, LGR, and LGG from the latches 110B, 110R, and 110G are at a low level and all the output signals B1–B12, R1–R12, and G1–G12 of the XOR gates 122B-1 through 122B-12, 122R-1 through 122R-12, and 122G-1 through 122G-12 are low as shown in FIG. 11.

As is to be appreciated, such test pattern data may be considered a series of low ("0") and high ("1") data pulses. Such use of both low and high data pulses may reduce the possibility of errors. For example, consider the situation in which test pattern data is a series of only high ("1") data pulses. In this situation, assume that a failure has occurred and, instead of a low ("0") data pulse being formed (which would indicate a failure), a "1" is erroneously formed and transmitted. As a result, such failure may not be determined or detected. However, by utilizing both low and high data pulses, even if such failure occurs and a "1" is erroneously formed or transmitted such failure would be detected. That is, the erroneously formed "1" would be detected as a failure upon utilizing the low data pulses.

Accordingly, the test pattern data may be generated as described above. Further, such test pattern data may be generated by any of the test pattern generators of the present apparatus such as, for example, the test pattern generator 202 of the jig 200 (FIG. 6). In this example, the test pattern data EAR, EAG, and EAB produced by the test pattern generator 202 of the jig 200 may be 12-bit parallel data such that the test pattern data EAB corresponds to the output signals B1–B12 of the aforementioned XOR gates 122B-1 to 122B-12, the test pattern data EAR corresponds to the output signals R1–R12 of the XOR gates 122R-1 to 122R-12, and the test pattern data EAG corresponds to the output signals G1–G12 of the XOR gates 122G-1 to 122G-12. Such generated test pattern data may be supplied through the signal selector 15 to the pattern comparator 23 of the pre-process circuit 20, in a manner as previously described and as shown in FIGS. 3A and 4.

The discrimination pattern generators of the present apparatus, such as the discrimination pattern generator 26 of the pre-process circuit 20, may be configured in a similar manner to that of the above-described test pattern generator shown in FIGS. 8 and 9. In such a situation, the output signals B1–B12 of the aforementioned XOR gates 122B-1 to 122B-12 may be the discrimination pattern data FAB, the output signals R1–R12 of the XOR gates 122R-1 to 122R-12 may be the discrimination pattern data FAR, and the output signals G1–G12 of the XOR gates 122G-1 to 122G-12 may be the discrimination pattern data FAG. Such discrimination pattern data may be supplied to the pattern comparator 23 (FIG. 4).

Figure 12:
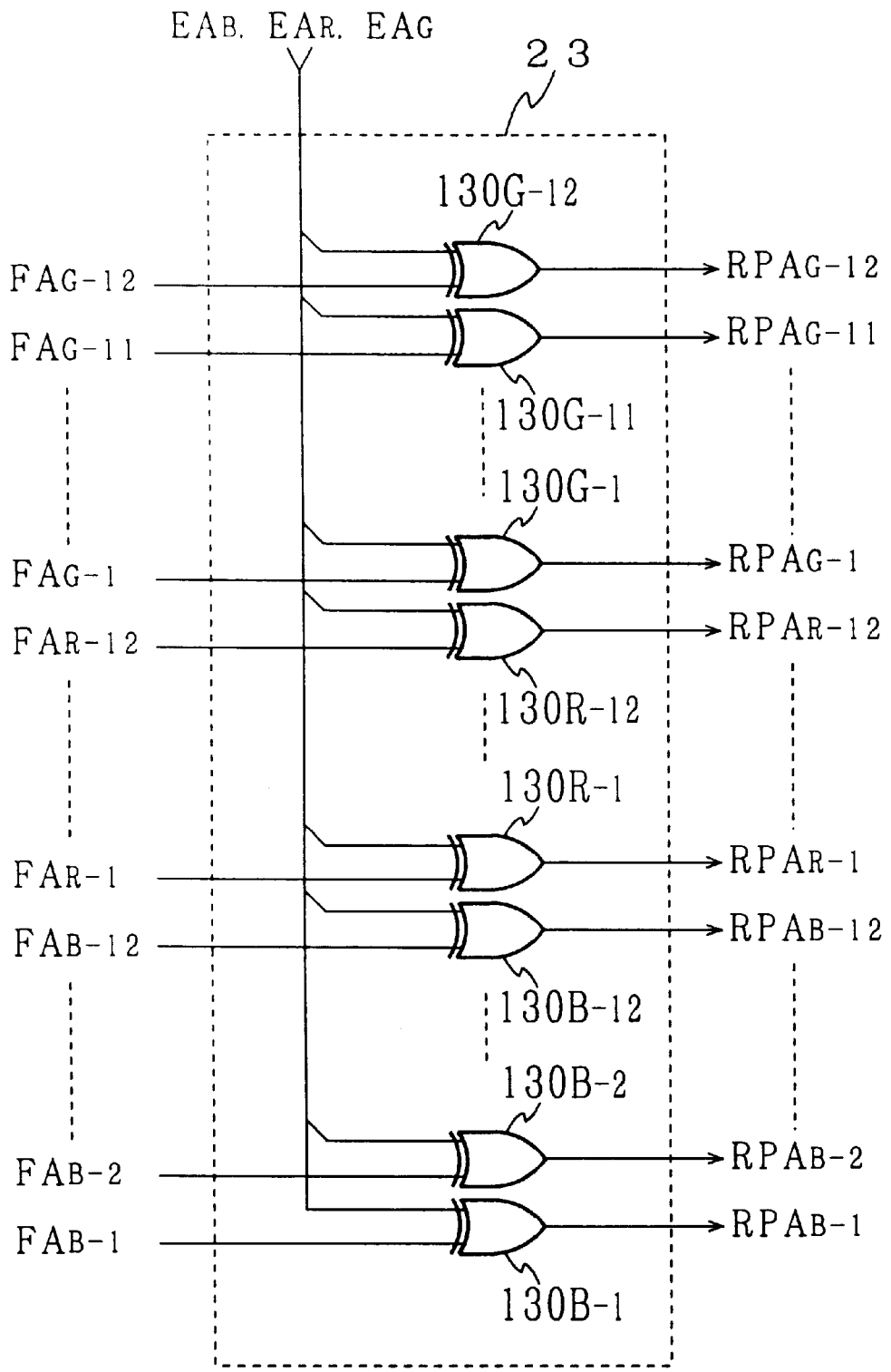
FIG. 12 is a diagram of a pattern comparator.

The pattern comparator 23 of the pre-process circuit 20 may be configured as shown in FIG. 12. Such pattern comparator 23 may receive the test pattern data EAB, EAR, and EAG from the jig 200 (FIG. 6) and the discrimination pattern data FAB, FAR, and FAG from the discrimination pattern generator 26 and may compare such received data. More specifically, as shown in FIG. 12, the test pattern data EAB, EAR, and EAG may be supplied to XOR gates 130B-1 through 130B-12, 130R-1 through 130R-12, and 130G-1 through 130G-12. For example, test pattern data EAB-1 may be supplied to the XOR gate 130B-1, test pattern data EAR-1 may be supplied to the XOR gate 130R-1, and so forth. As further shown in FIG. 12, the discrimination pattern data FAB, FAR, and FAG may be supplied to the XOR gates 130B-1 through 130B-12, 130R-1 through 130R-12, and 130G-1 through 130G-12. For example, discrimination pattern data FAB-1 may be supplied to the XOR gate 130B-1, discrimination pattern data FAR-1 may be supplied to the XOR gate 130R-1, and so forth. Accordingly, when the test pattern data EAB, EAR, and EAG and the discrimination pattern data FAB, FAR and FAG are properly transmitted in synchronism to the pattern comparator 23, all of the output signals RPAB-1 through RPAB-12, RPAR-1 through RPAR-12, and RPAG-1 through RPAG-12 of the XOR gates 130B-1 through 130B-12, 130R-1 through 130R-12, and 130G-1 through 130G-12 are rendered low. On the other hand, if a portion of the test pattern data is improperly transmitted to the pattern comparator 23, such as which may occur when a failure or fault exists, the output of the corresponding XOR gate may be rendered high. As a result, a failure such as a break or short circuit in a signal line or the like may be readily and easily detected.

Figure 13:
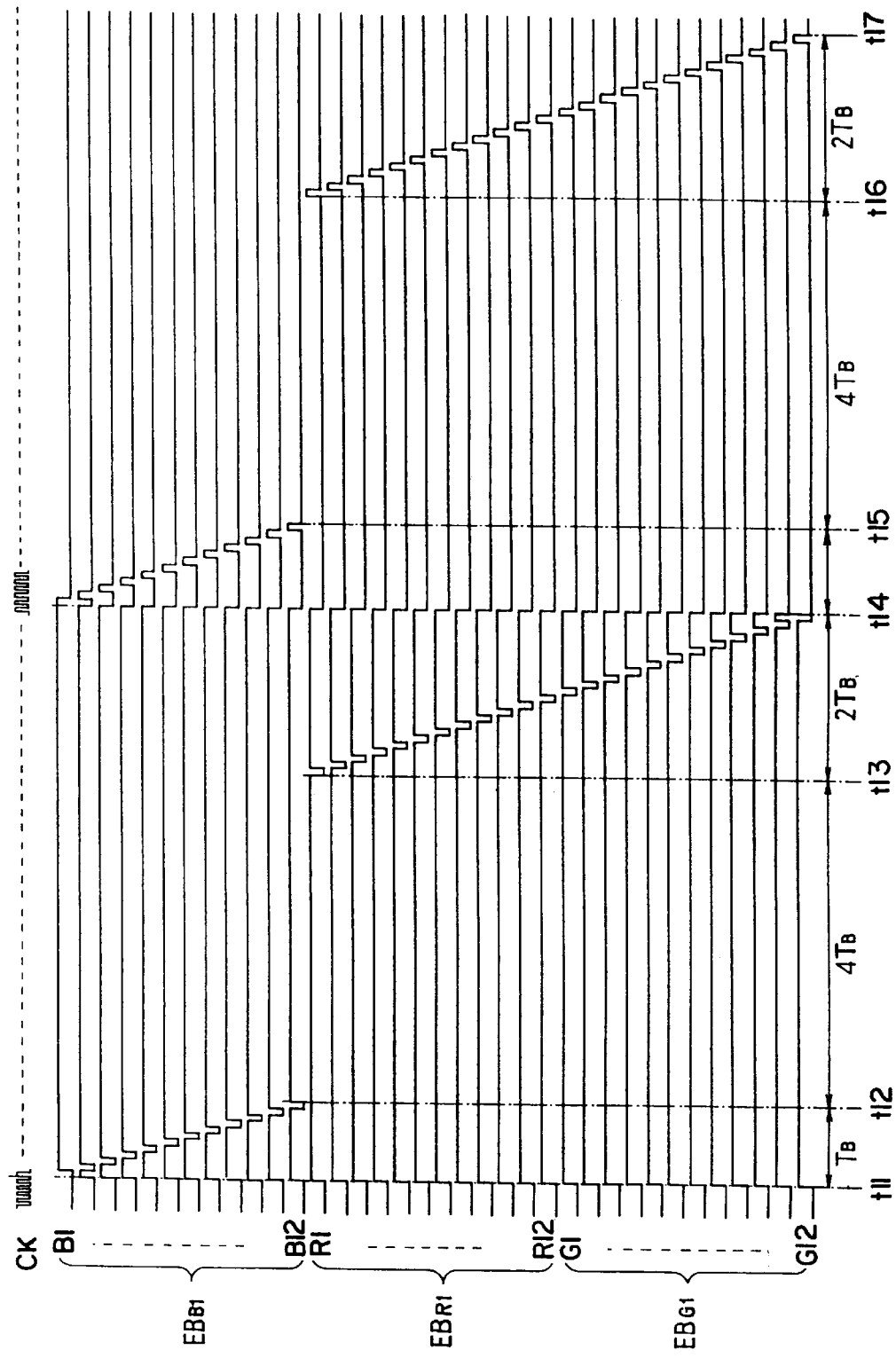
FIG. 13 is a diagram of test pattern data EBB1, EBR1, and EBG1 supplied by the test pattern generator.

As previously described, and as illustrated in FIG. 3A, the selected data POR and POG from the pre-process circuit 20 may be delayed by one horizontal scanning period by the delayers 51AR and 51AG and supplied as the selected data POAR and POAG to the process circuit 30, and the selected data POR and POG may be delayed by two horizontal scanning periods by the delayers 51AR, 51BR, 51AG, and 51BG and supplied as the selected data POBR and POBG to the process circuit 30. As a result, the test pattern generator 27 of the pre-process circuit 20 (FIG. 4) may output test pattern data EBB1, EBR1, and EBG1 with a timing sequence which may correspond to the delayed selected data after a predetermined time elapse or delay of, for example, TA from a pulse of the horizontal synchronizing signal HD during a horizontal scanning period in which the image-sensed data DAR, DAG, and DAB have an optical black level (VOPB), such as shown in FIGS. 13 and 16. More specifically, the outputting of test pattern data EBB1 may be initiated at a time t11 and completed at a time t12, the outputting of test pattern data EBR1 may be initiated at a time t13 after an elapse or delay of 4TB, and the outputting of test pattern data EBG1 may be initiated after the completion of the test pattern data EBR1 and may be completed at a time t14. (The period between the times t11 and t12 is TB, the period between the times t12 and t13 is 4TB, and the period between the times t13 and t14 is 4TB.) Next, the polarity of the pulse for the test pattern data may be reversed and the outputting of the test pattern data EBB1 may be initiated at a time t14 and completed at a time t15, the outputting of the test pattern data EBR1 may be initiated at a time t16 after an elapse of 4 TB, and the outputting of the test pattern data EBG1 may be initiated after the completion of the test pattern data EBR1 and may be completed at a time t17. (The period between the times t14 and t15 is TB, the period between the times t15 and t16 is 4TB, and the period between the times t16 and t17 is 2TB.) As is to be appreciated, the timing sequence or arrangement of the test pattern data EBB, EBR, and EBG may be different from that described above.

Thus, when the test pattern data EBB1, EBR1, and EBG1 are respectively selected by the signal selectors 25B, 25R, and 25G of the pre-process circuit 20 (FIG. 4), such data may be outputted therefrom and delayed in the manner previously described so as to form the selected data POB, POR, POG, POAR, POAG, POBR, and POBG which are supplied to the process circuit 30 in a timing sequence such as that shown in FIG. 16. That is, as shown in FIG. 16, the test pattern data EBB1, EBR1, and EBG1 may be supplied as the selected data POB, POR, and POG starting at a time t11 after an elapse or time delay of TA as viewed along a horizontal synchronizing signal HD. During the next horizontal scanning period, the test pattern data EBB2, EBR2, and EBG2 may be outputted after an elapse or time delay of TA along the horizontal synchronizing signal with a timing sequence such as that shown in FIGS. 14 and 16. More specifically, the outputting of the test pattern data EBB2 may be initiated at a time t21 and is completed at a time t22, the outputting of the test pattern data EBR2 may be initiated at a time t23 after an elapse or delay of 2TB, and the outputting of the test pattern data EBG2 may be initiated after the completion of the test pattern data EBR2 and may be completed at a time t24. (The period between the times t21 and t22 is TB, the period between the times t22 and t23 is 2TB, and the period between the times t23 and t24 is 2TB.) Next, the polarity of the pulse for the test pattern data may be reversed and the outputting of the test pattern data EBB2 may be initiated at a time t25 after an elapse or time delay of 2TB from the time t24 and completed at a time t26, the outputting of the test pattern data EBR2 may be initiated at a time t27 after an elapse or time delay of 2TB, the outputting of the test pattern data EBG2 may be initiated after the completion of the test pattern data EBR2 and may be completed at a time t28.

Thus, when the test pattern data EBB2, EBR2, and EBG2 are respectively selected by the signal selectors 25B, 25R, and 25G of the pre-process circuit 20 (FIG. 4), such data may be supplied therefrom as the selected data POB, POR, and POG starting at the time t21 as shown in FIG. 16. Further, the test pattern data EBR1 and EBG1 may be supplied as the selected data POAR and POAG starting at the time t24 upon completion of the supply of the test pattern data EBG2.

During the next horizontal scanning period, test pattern data EBB3, EBR3, and EBG3 may be successively outputted after an elapse or time delay of TA along the horizontal synchronizing signal so as to start at a time t31 and be completed at a time t32 and have a timing sequence or arrangement as, for example, shown in FIGS. 15 and 16. After an elapse or time delay of 4TB from the time t32 or at a time t34, the polarity of the pulse for the test pattern data may be reversed and the test pattern data EBB3, EBR3, and EBG3 may be successively outputted from a time t34 until completion at a time t35.

Thus, when the test pattern data EBB3, EBR3, and EBG3 are selected by the signal selectors 25B, 25R, and 25G of the pre-process circuit 20 (FIG. 4), such data may be supplied therefrom as the selected data POB, POR, and POG starting at the time t31 as shown in FIG. 16. Further, the test pattern data EBR2 and EBG2 may be supplied as the selected data POAR and POAG, starting at time t32 upon completion of the test pattern data EBG3. Furthermore, the test pattern data EBR1 and EBG1 may be supplied as the selected data POBR and POBG starting at time t33 upon completion of the test pattern data EBG2.

Therefore, in the manner previously described, the selected data POB, POR, POG, POAR, POAG, POBR, and POBG may form a train of continuous pulses which are supplied to the pattern comparator 39 of the process circuit 30 (FIG. 5). Further, the discrimination pattern generator 41 may generate discrimination test pattern data FB which is substantially the same as the selected data POB, POR, POG, POAR, POAG, POBR, and POBG. The pattern comparator 39 may utilize a number of exclusive-ORs to compare the discrimination pattern data FB and the selected data POB, POR, POG, POAR, POAG, POBR, and POBG, in a manner similar to that described above with reference to the pattern generator 23. As such, upon the occurrence of a failure, the corresponding output of the pattern comparator 39 may be rendered high. As a result, the failure or faulty spot may be readily or easily detected.

Failures or faulty spots between other circuits in the present apparatus, such as between the process circuit 30 and the rate converter circuit 60 or the rate converter circuit 60 and the VTR block 22 or the like, may be determined in a similar manner to that described above. That is, in such situations, test pattern data may be generated on a first or transmitting side (circuit) and discrimination pattern data having substantially the same data pattern as the test pattern data may be generated on a second or receiving side (circuit), such test generated pattern data and discrimination pattern data may be timely or simultaneously supplied to a pattern comparator wherein such data is compared, and a failure or faulty spot may be determined in accordance with the results of such comparison.

Accordingly, the present invention may enable a determination to be easily made as to whether or not an integrated circuit has been implemented properly, the connection(s) between printed circuit boards having integrated circuits is proper, and so forth, and may enable defective spots to be easily detected. Additionally, determinations as to the state of connections between circuits or devices within the apparatus (such as the camera apparatus) may be made while such apparatus is operating. As a result, normal operations of the apparatus may be performed or continued while such connection state determinations are made.

Therefore, according to the present invention, test pattern data having pulses whose timing or sequence arrangement are shifted in a manner as previously described may be produced on a transmitting side or circuit and supplied through a plurality of signal lines at a transmission rate substantially equivalent to that of other data, discrimination pattern data having substantially the same pattern as the test pattern data may be generated in synchronism with the test pattern data on a receiving side or circuit, and such data may be compared so as to determine a failure or a faulty spot. Further, since the test pattern data may be supplied during a horizontal scanning or blanking period or the like in which image-sensed data DAR, DAG, and DAB may have an optical black level (VOPB), a failure or faulty spot developed during a picture taking operation or during an initial operation of a video camera prior to photographing may be detected in a relatively quick manner and without adverse effects upon such operations. Furthermore, by utilizing pulse information as test pattern data, a determination as to whether or not image data or the like has been properly transmitted or whether or not a signal line is properly conducting signals may be made.

Although in the above description the present invention was described as determining failures or faulty spots between signal processing circuits or connections of a video camera and a VTR block, the present invention is not so limited. That is, the present invention may be applied to determined failures between devices or circuits of any electrical or processing type apparatus or the like.

Japanese Patent No. 4-258097 and corresponding Japanese Patent Abstract 92-258097, Japanese Patent No. 4-245893 and corresponding Japanese Patent Abstract 92-245893, Japanese Patent No. 4-281691 and corresponding Japanese Patent Abstract 92-281691, and Japanese Patent No. 4-276839 and corresponding Japanese Patent Abstract 92-276839 are hereby incorporated by reference.

Although preferred embodiments of the present invention and modifications thereof have been described in detail herein, it is to be understood that this invention is not limited to these embodiments and modifications, and that other modifications and variations may be effected by one skilled in the art without departing from the spirit and scope of the invention as defined by the appended claims.

What is claimed is:

1. A digital signal processing apparatus comprising:
    a data input unit for receiving transmission data at a transmission data rate and for receiving test pattern data at a data rate which is substantially the same as said transmission data rate, said test pattern data includes plural parallel data signals with each data signal having a plurality of bit values and all but one of the bit values have the same value so as to form a respective data pulse in each data signal, said data pulse being shifted from data signal to data signal by one bit;
    a discrimination pattern generating unit for generating discrimination pattern data synchronized with said test pattern data received by said data input unit;
    a pattern comparator for comparing said test pattern data and said discrimination pattern data; and
    a self-diagnosing unit for detecting a faulty spot on a line for transmitting the transmission data based on the result of comparison by said pattern comparator.

2. A signal processing apparatus comprising a first device and a second device detachably connected to said first device, said first device including,
    a test pattern generating unit for generating predetermined test pattern data and for supplying the generated test pattern data to said second device at a transmission rate which is substantially the same as that of transmission data transferred between said first device and said second device, said test pattern data includes plural parallel data signals with each data signal having a plurality of bit values and all but one of the bit values have the same value so as to form a respective data pulse in each data signal, said data pulse being shifted from data signal to data signal by one bit,
    said second device including,
        a discrimination pattern generating unit for generating discrimination pattern data synchronized with said test pattern data supplied from said first device,
        a pattern comparator for comparing said test pattern data and said discrimination pattern data, and
        a self-diagnosing unit for detecting a faulty spot on a data transmission line between said first and second devices based on the result of comparison by said pattern comparator.

3. A self-diagnosing method comprising the steps of:
    supplying predetermined test pattern data from a first device to a second device at a transmission rate which is the same as that of transmission data, said test pattern data includes plural parallel data signals with each data signal having a plurality of bit values and all but one of the bit values have the same value so as to form a respective data pulse in each data signal, said data pulse being shifted from data signal to data signal by one bit;
    generating discrimination pattern data at said second device which is synchronized with said test pattern data; and
    comparing said test pattern data and said discrimination pattern data and detecting a faulty spot on a data transmission line between said first device and said second device based on the result of the comparison.

4. An integrated circuit comprising:
    a data input unit for receiving transmission data at a transmission data rate and for receiving test pattern data at a data rate which is substantially the same as said transmission data rate, said test pattern data includes plural parallel data signals with each data signal having a plurality of bit values and all but one of the bit values have the same value so as to form a respective data pulse in each data signal, said data pulse being shifted from data signal to data signal by one bit;
    a discrimination pattern generating unit for generating discrimination pattern data synchronized with said test pattern data received by said data input unit;
    a pattern comparator for comparing said test pattern data and said discrimination pattern data; and
    a self-diagnosing unit for detecting a faulty spot on a line for transmitting the transmission data based on the result of comparison by said pattern comparator.

5. A signal processing apparatus comprising a first integrated circuit and a second integrated circuit connected to said first integrated circuit, said first integrated circuit including,
    a test pattern generating unit for generating predetermined test pattern data and for supplying the generated test pattern data to said second integrated circuit at a transmission rate which is substantially the same as that of transmission data transferred between said first integrated circuit and said second integrated circuit, , said test pattern data includes plural parallel data signals with each data signal having a plurality of bit values and all but one of the bit values have the same value so as to form a respective data pulse in each data signal, said data pulse being shifted from data signal to data signal by one bit,
    second integrated circuit including,
        a discrimination pattern generating unit for generating discrimination pattern data synchronized with said test pattern data supplied from said first integrated circuit,
        a pattern comparator for comparing said test pattern data and said discrimination pattern data, and
        a self-diagnosing unit for detecting a faulty spot on a data transmission line between said first and second integrated circuits based on the result of comparison by said pattern comparator.

6. A self-diagnosing method comprising the steps of:
    supplying predetermined test pattern data from a first integrated circuit to a second integrated circuit at a transmission rate which is the same as that of transmission data, said test pattern data includes plural parallel data signals with each data signal having a plurality of bit values and all but one of the bit values have the same value so as to form a respective data pulse in each data signal, said data pulse being shifted from data signal to data signal by one bit;

generating discrimination pattern data at said second integrated circuit which is synchronized with said test pattern data; and comparing said test pattern data and said discrimination pattern data and detecting a faulty spot on a data transmission line between said first integrated circuit and said second integrated circuit based on the result of the comparison.

7. An apparatus for detecting a failure between a first unit and a second unit, said apparatus comprising:

first generating means located in said first unit for generating a first pattern of data and for supplying the generated first pattern of data to said second unit, said first pattern of data includes plural parallel data signals with each data signal having a plurality of bit values and all but one of the bit values have the same value so as to form a respective data pulse in each data signal, said data pulse being shifted from data signal to data signal by one bit;

second generating means located in said second unit for generating a second pattern of data synchronized with said first pattern of data supplied from said first unit;

comparing means for comparing said first and second patterns of data; and means for detecting a failure between said first and second units based on the result of the comparison by said comparing means.

8. An apparatus according to claim 7, further comprising means for delaying a number of said data signals of said first pattern of data.

9. An apparatus according to claim 7, wherein said first pattern of data is supplied to said second unit during a predetermined period.

10. An apparatus according to claim 9, wherein said predetermined period is a horizontal blanking period.

11. An apparatus according to claim 8, wherein said first and second units are first and second integrated circuits, respectively.

12. An apparatus according to claim 8, wherein said first and second units are detachably coupled together.

13. An apparatus according to claim 12, wherein said first and second units are included in a digital video camera.

14. A method for detecting a failure between a first unit and a second unit, said method comprising the steps of:

generating a first pattern of data at said first unit and supplying the generated first pattern of data to said second unit, said first pattern of data includes plural parallel data signals with each data signal having a plurality of bit values and all but one of the bit values have the same value so as to form a respective data pulse in each data signal, said data pulse being shifted from data signal to data signal by one bit;

generating a second pattern of data at said second unit which is synchronized with said first pattern of data supplied from said first unit;

comparing said first and second patterns of data; and detecting a failure between said first and second units based on the comparison result.

15. A method according to claim 14, further comprising the step of delaying a number of said data signals of said first pattern of data.

16. A method according to claim 14, wherein said first pattern of data is supplied to said second unit during a predetermined period.

17. A method according to claim 16, wherein said predetermined period is a horizontal blanking period.

18. A method according to claim 14, wherein said first and second units are first and second integrated circuits, respectively.

19. A method according to claim 14, wherein said first and second units are detachably coupled together.

20. A method according to claim 19, wherein said first and second units are included in a digital video camera.

21. A digital signal processing apparatus according to claim 1, wherein said data input unit receives two cycles of the parallel data signals and wherein the data pulses of the parallel data signals of a first cycle have a first value and the data pulses of the parallel data signals of a second cycle have a second value which is different from the first value.

22. A signal processing apparatus according to claim 2, wherein said test pattern generating unit generates and supplies two cycles of the parallel data signals and wherein the data pulses of the parallel data signals of a first cycle have a first value and the data pulses of the parallel data signals of a second cycle have a second value which is different from the first value.

23. A self-diagnosing method according to claim 3, wherein the supplying step supplies two cycles of the parallel data signals from the first device to the second device and wherein the data pulses of the parallel data signals of a first cycle have a first value and the data pulses of the parallel data signals of a second cycle have a second value which is different from the first value.

24. An integrated circuit according to claim 4, wherein said data input unit receives two cycles of the parallel data signals and wherein the data pulses of the parallel data signals of a first cycle have a first value and the data pulses of the parallel data signals of a second cycle have a second value which is different from the first value.

25. A signal processing apparatus according to claim 5, wherein said test pattern generating unit generates and supplies two cycles of the parallel data signals and wherein the data pulses of the parallel data signals of a first cycle have a first value and the data pulses of the parallel data signals of a second cycle have a second value which is different from the first value.

26. A self-diagnosing method according to claim 6, wherein the supplying step supplies two cycles of the parallel data signals from the first integrated circuit to the second integrated circuit and wherein the data pulses of the parallel data signals of a first cycle have a first value and the data pulses of the parallel data signals of a second cycle have a second value which is different from the first value.

27. An apparatus according to claim 7, wherein said first generating means generates and supplies two cycles of the parallel data signals and wherein the data pulses of the parallel data signals of a first cycle have a first value and the data pulses of the parallel data signals of a second cycle have a second value which is different from the first value.

28. A method according to claim 14, wherein the step of generating a first pattern of data generates and supplies two cycles of the parallel data signals and wherein the data pulses of the parallel data signals of a first cycle have a first value and the data pulses of the parallel data signals of a second cycle have a second value which is different from the first value.

* * * * *